US010944392B2

(12) United States Patent
Yano et al.

(10) Patent No.: US 10,944,392 B2
(45) Date of Patent: Mar. 9, 2021

(54) SWITCH CIRCUIT AND POWER SUPPLY SYSTEM

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Yusuke Yano, Mie (JP); Katsuma Tsukamoto, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 343 days.

(21) Appl. No.: 15/772,175

(22) PCT Filed: Oct. 27, 2016

(86) PCT No.: PCT/JP2016/081826
§ 371 (c)(1),
(2) Date: Apr. 30, 2018

(87) PCT Pub. No.: WO2017/086113
PCT Pub. Date: May 26, 2017

(65) Prior Publication Data
US 2018/0367133 A1 Dec. 20, 2018

(30) Foreign Application Priority Data
Nov. 17, 2015 (JP) .............................. JP2015-224625

(51) Int. Cl.
*H03K 17/0812* (2006.01)
*H03K 17/0814* (2006.01)
(Continued)

(52) U.S. Cl.
CPC ....... *H03K 17/08122* (2013.01); *B60R 16/02* (2013.01); *H02H 7/00* (2013.01);
(Continued)

(58) Field of Classification Search
USPC .................................... 361/86–87, 93.7–93.9
See application file for complete search history.

(56) References Cited

U.S. PATENT DOCUMENTS 4,809,122 A * 2/1989 Fitzner ..................... H02H 3/06
                                                    318/434
5,027,250 A * 6/1991 Cini ....................... H02H 9/046
                                                    307/127
(Continued)

FOREIGN PATENT DOCUMENTS

JP          2008-193839 A       8/2008
JP          2011-178384 A       9/2011
(Continued)

OTHER PUBLICATIONS

Search Report for PCT/JP2016/081826, dated Jan. 17, 2017.

*Primary Examiner* — Danny Nguyen
(74) *Attorney, Agent, or Firm* — Honigman LLP

(57) ABSTRACT

In a switch circuit for use in a vehicle, conduction between a drain electrode and a gate electrode of each of a first main transistor and a second main transistor is switched on or off depending on a voltage between the gate electrode and a source electrode. A first surge protection device is connected between the drain electrodes of the first main transistor and the second main transistor. The first surge protection device keeps a voltage that is applied to the first surge protection device at a first predetermined voltage or lower. A sub transistor is provided between the gate electrodes and the source electrodes of the first main transistor and the second (Continued)

main transistor. The sub transistor is turned on when the first main transistor and the second main transistor are turned off.

8 Claims, 9 Drawing Sheets

(51) Int. Cl.
    *H03K 17/12*     (2006.01)
    *H03K 17/16*     (2006.01)
    *H02J 7/00*     (2006.01)
    *H02H 7/00*     (2006.01)
    *H02H 9/04*     (2006.01)
    *B60R 16/02*     (2006.01)
    *H02M 3/335*     (2006.01)

(52) U.S. Cl.
    CPC .............. *H02H 9/04* (2013.01); *H02J 7/00* (2013.01); *H02M 3/335* (2013.01); *H03K 17/08142* (2013.01); *H03K 17/122* (2013.01); *H03K 17/16* (2013.01); *H03K 17/161* (2013.01); *H02H 9/041* (2013.01); *H03K 2217/0009* (2013.01)

(56) References Cited

U.S. PATENT DOCUMENTS

| | | | |
|---|---|---|---|
| 5,488,283 A | | 1/1996 | Dougherty et al. |
| 5,945,868 A | * | 8/1999 | Robb ............... H03K 17/08128 |
| | | | 323/275 |
| 7,623,326 B2 | * | 11/2009 | Schwenkel .......... H01F 7/1844 |
| | | | 361/23 |
| 2005/0088216 A1 | * | 4/2005 | Arndt ..................... H01L 23/62 |
| | | | 327/325 |
| 2016/0308523 A1 | * | 10/2016 | Otake ................ H01L 29/7805 |

FOREIGN PATENT DOCUMENTS

| JP | 2012-170268 A | 9/2012 |
|---|---|---|
| JP | 2016/081826 A | 1/2017 |

\* cited by examiner

SWITCH CIRCUIT AND POWER SUPPLY SYSTEM

CROSS-REFERENCE TO RELATED APPLICATIONS

This application is the U.S. national stage of PCT/JP2016/081826 filed Oct. 27, 2016, which claims priority of Japanese Patent Application No. 2015-224625 filed on Nov. 17, 2015.

TECHNICAL FIELD

The present invention relates to a switch circuit and a power supply system.

BACKGROUND

The switch circuit disclosed in JP H-05-218833A includes an NPN bipolar transistor. The bipolar transistor is turned on or off as a result of a voltage at a base electrode of the bipolar transistor that takes the potential at an emitter electrode thereof as a reference being adjusted. When the voltage at the base electrode that takes the potential at the emitter electrode as a reference is equal to or greater than a predetermined voltage, then the bipolar transistor is turned on, and an electric current can flow between a collector electrode and the emitter electrode of the bipolar transistor. When the voltage at the base electrode that takes the potential at the emitter electrode as a reference is lower than the predetermined voltage, then the bipolar transistor is turned off, and no electric current will flow between the collector electrode and the emitter electrode of the bipolar transistor. When the bipolar transistor is ON, the resistance value between the collector electrode and the emitter electrode is lower the higher the voltage at the base electrode that takes the potential at the emitter electrode as a reference.

SUMMARY

According to one aspect of the present invention, a switch circuit for use in a vehicle includes: a transistor circuit including a first main transistor that is provided with a first electrode, a second electrode, and a control electrode, and in which conduction between the first electrode and the second electrode is switched on or off depending on a voltage between the control electrode and the second electrode; a first surge protection device that is connected between ends of the transistor circuit, and is configured to keep a voltage that is applied to the first surge protection device at a first predetermined voltage or lower; and a sub transistor that is provided between the control electrode and the second electrode of the first main transistor, and is turned on when the first main transistor is turned off, wherein a first wire is connected to one end of the transistor circuit, a second wire is connected to another end of the transistor circuit, an electric current flows through the first wire, the transistor circuit, and the second wire while the first main transistor is ON, and an electric current flows through the first wire, the first surge protection device, and the second wire when the first main transistor is turned off.

According to one aspect of the present invention, a power supply system includes: the above-described switch circuit; and a first electric storage unit whose positive electrode is connected to the one end of the transistor circuit via the first wire; and a second electric storage unit whose positive electrode is connected to the other end of the transistor circuit via the second wire.

DETAILED DESCRIPTION OF PREFERRED EMBODIMENTS

Figure 1:
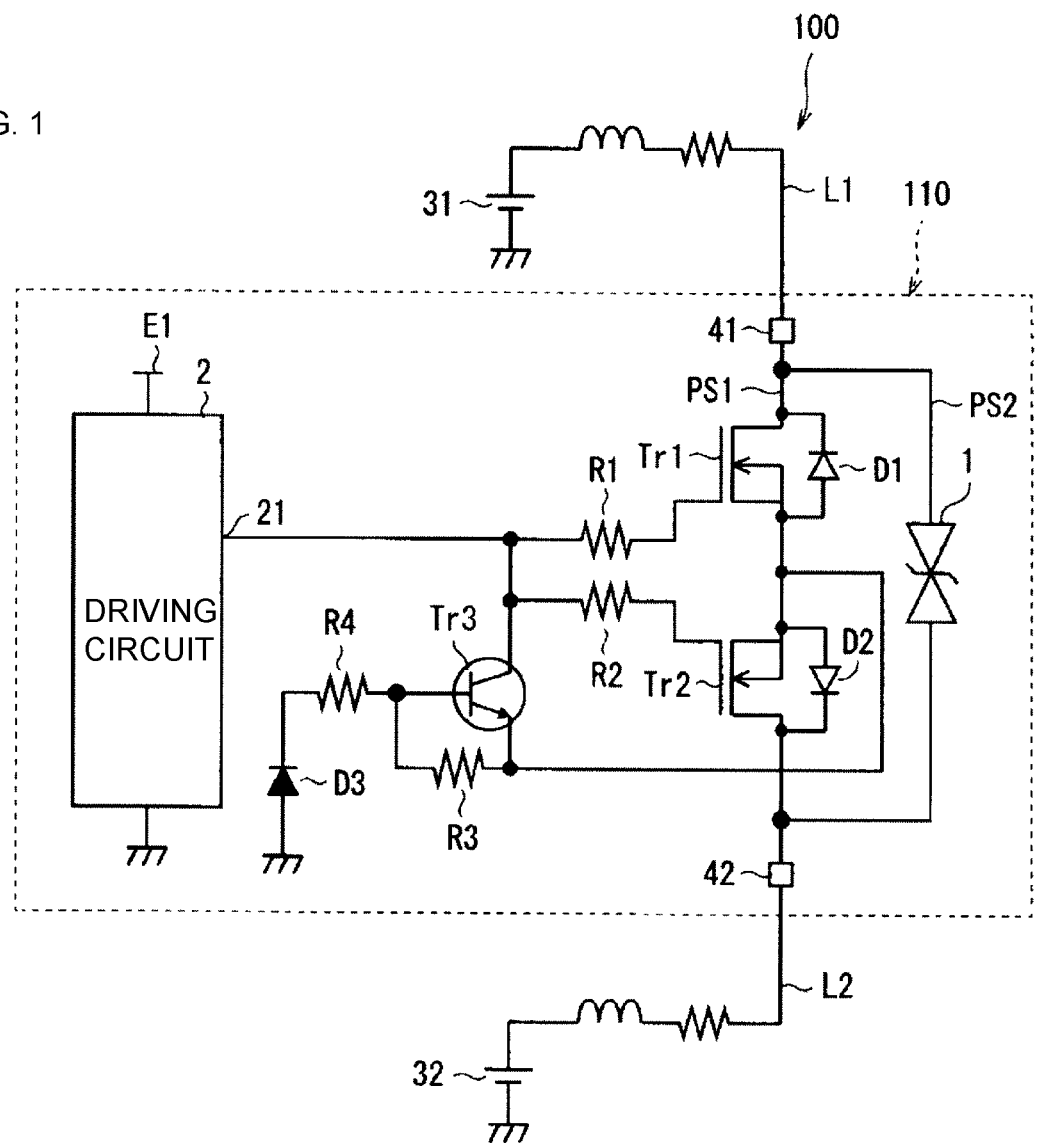
FIG. 1 is a schematic diagram illustrating a configuration of a power supply system according to Embodiment 1.

In the switch circuit disclosed in JP H-05-218833A, for example, a positive electrode of an electric storage unit is connected to the collector electrode of the bipolar transistor, the emitter electrode of the bipolar transistor is connected to one end of a load, and a negative electrode of the electric storage unit and the other end of the load are grounded. In this case, when the bipolar transistor is turned on, the electric storage unit supplies electric power to the load via the bipolar transistor, and when the bipolar transistor is turned off, the supply of the electric power from the electric storage unit to the load is interrupted.

To turn the bipolar transistor on, a voltage at the base electrode of the bipolar transistor that takes the ground potential as a reference is raised to increase a voltage at the base electrode that takes the potential at the emitter electrode as a reference. To turn the bipolar transistor off, the voltage at the base electrode of the bipolar transistor that takes the ground potential as a reference is lowered to decrease the voltage at the base electrode that takes the potential at the emitter electrode as a reference.

A wire that connects the bipolar transistor and the load contains an inductive component (hereinafter, referred to as "wire inductance"). As long as the bipolar transistor is ON, an electric current flows through the wire, and energy is accumulated in the wire inductance.

If the voltage at the base of the bipolar transistor that takes the ground potential as a reference is lowered to turn the bipolar transistor off, then a resistance value between the collector electrode and the emitter electrode of the bipolar transistor increases, and the electric current flowing through the wire decreases. At this time, the wire inductance keeps the electric current flowing through the wire, by lowering a voltage at the emitter electrode that takes the ground potential as a reference to keep the voltage at the base electrode that takes the potential at the emitter electrode as a reference at a predetermined voltage or greater. Accordingly, the electric current flows through the bipolar transistor, and the energy accumulated in the wire inductance is discharged. When the energy has become zero, the voltage at the base electrode that takes the potential at the emitter electrode as a reference is reduced to a voltage lower than the predetermined voltage, and the bipolar transistor is turned off.

Because the voltage at the base electrode that takes the potential at the emitter electrode as a reference is low as long as the wire inductance keeps the voltage at the emitter electrode that takes the ground potential as a reference at a predetermined voltage or greater, the resistance value between the collector electrode and the emitter electrode of the bipolar transistor is large. Accordingly, the bipolar transistor consumes a large amount of power, and generates a large amount of heat. Therefore, there is the risk that the bipolar transistor may become hot and malfunction.

Therefore, it is an object of the present application to provide a switch circuit in which a transistor generates a small amount of heat when it is turned off, and a power supply system that is provided with the switch circuit.

Advantageous Effects of Disclosure

According to this disclosure, a transistor generates a small amount of heat when it is turned off.

Solution to Problem

First, embodiments of the present invention will be described in order. Furthermore, at least some of the embodiments, which will be described below, may suitably be combined with each other.

(1) According to one aspect of the present invention, a switch circuit for use in a vehicle including: a transistor circuit including a first main transistor that is provided with a first electrode, a second electrode, and a control electrode, and in which conduction between the first electrode and the second electrode is switched on or off depending on a voltage between the control electrode and the second electrode; a first surge protection device that is connected between ends of the transistor circuit, and is configured to keep a voltage that is applied to the first surge protection device at a first predetermined voltage or lower; and a sub transistor that is provided between the control electrode and the second electrode of the first main transistor, and is turned on when the first main transistor is turned off, wherein a first wire is connected to one end of the transistor circuit, a second wire is connected to another end of the transistor circuit, an electric current flows through the first wire, the transistor circuit, and the second wire while the first main transistor is ON, and an electric current flows through the first wire, the first surge protection device, and the second wire when the first main transistor is turned off.

According to one aspect, for example, the first main transistor is turned on when a voltage at its control electrode that takes the potential at its second electrode as a reference is equal to or greater than a predetermined voltage, and an electric current flows through the first wire, the transistor circuit, and the second wire while the first main transistor is ON. The first main transistor is turned off when the voltage at its control electrode that takes the potential at its second electrode as a reference is lower than the predetermined voltage. If the first main transistor is turned off by lowering a voltage at the control electrode of the first main transistor that takes a fixed potential, for example, the ground potential as a reference, then the sub transistor is turned on, and thus the voltage at the control electrode that takes the potential at the second electrode as a reference is kept at a voltage lower than the predetermined voltage, so that the first main transistor remains OFF. As a result, the first main transistor generates a small amount of heat when it is turned off.

Furthermore, when the first main transistor is turned off, due to wire inductances of the first and second wires, a voltage at the first electrode that takes the fixed potential as a reference increases, and a voltage at the second electrode that takes the fixed potential as a reference decreases. In the present aspect, the first surge protection device is connected between the ends of the transistor circuit. Accordingly, when the first main transistor is turned off, an electric current flows through the first wire, the first surge protection device, and the second wire, and a voltage that is applied to ends of the first main transistor is kept at a voltage equal to or lower than the first predetermined voltage.

(2) Preferably, in the switch circuit according to one aspect of the present invention, the transistor circuit includes a second main transistor that is connected to the first electrode or the second electrode of the first main transistor, and the first main transistor and the second main transistor are turned on or off at the same time.

According to one aspect, the second main transistor is connected to the first main transistor, and the first main transistor and the second main transistor are turned on or off at the same time. For example, if the first main transistor and the second main transistor are FETs (Field Effect Transistors), a diode is formed between the first electrode and the second electrode of each of the first main transistor and the second main transistor. It is possible to connect the first main transistor and the second main transistor such that the anodes or the cathodes of the diodes of the first main transistor and the second main transistor are connected to each other. In this case, if the first main transistor and the second main transistor are OFF, no electric current will flows through the diodes of the first main transistor and the second main transistor.

(3) Preferably, the switch circuit according to one aspect of the present invention further includes: an interrupting switch that is connected between the transistor circuit and the first surge protection device.

According to one aspect, if the interrupting switch is OFF, then no electric current will flow through the first surge protection device. In a case where two electric storage units are connected to each other via the transistor circuit, there is a possibility that a large current may flow if the positive electrode of one electric storage unit is connected by mistake to the negative electrode of the other electric storage unit via the transistor circuit. However, if the first main transistor and the interrupting switch are OFF, then no large current will flow through the first surge protection device 1.

(4) Preferably, the switch circuit according to one aspect of the present invention further includes: a switch control unit that is configured to turn on the interrupting switch prior to turning on the first main transistor, and turn off the interrupting switch when a predetermined period has elapsed since the first main transistor was turned off.

According to one aspect, since the interrupting switch is turned on prior to the first main transistor being turned on, and the interrupting switch is turned off when a predetermined period has elapsed since the first main transistor was turned off, the first surge protection device operates appropriately.

(5) Preferably, the switch circuit according to one aspect of the present invention further includes: a second surge protection device that is connected between the transistor circuit and the first surge protection device, and is configured to keep a voltage that is applied to the second surge protection device at a second predetermined voltage or lower; and a protection transistor that is connected between a connection node located between the first main transistor and the second main transistor, and a connection node located between the first surge protection device and the second surge protection device.

According to one aspect, if the first main transistor and the second main transistor are, for example, FETs, then a diode is formed between the first electrode and the second electrode of each of the first main transistor and the second main transistor. At this time, the anode (or cathode) of one diode is connected to the anode (or cathode) of the other diode. Accordingly, if the first main transistor and the second main transistor are OFF, then no electric current will flow through the two diodes. If the protection transistor is OFF, then no electric current will flow through the first surge protection device or the second surge protection device unless a voltage at both ends of the transistor circuit is a sum of the first predetermined voltage and the second predetermined voltage. Accordingly, no large current will flow through the first surge protection device and the second surge protection device as long as the first main transistor and the protection transistor are OFF, even if a wrong electrode of an electric storage unit is connected to the transistor circuit.

Furthermore, in a case where the protection transistor is ON, an electric current will flow through the first surge protection device or the second surge protection device if a voltage that is equal to or greater than the first predetermined voltage or the second predetermined voltage is applied between both ends of the transistor circuit. At this time, an electric current flows through the diode formed at the first main transistor or the second main transistor.

(6) Preferably, the switch circuit according to one aspect of the present invention further includes: a switch control unit that is configured to turn on the protection transistor prior to turning on the first main transistor and the second main transistor, and turn off the protection transistor when a predetermined period has elapsed since the first main transistor and the second main transistor were turned off.

(7) According to one aspect, the protection transistor is turned on prior to the first main transistor and the second main transistor being turned on, and the protection transistor is turned off when a predetermined period has elapsed since the first main transistor and the second main transistor were turned off. Accordingly, the first surge protection device and the second surge protection device operate appropriately.

(8) Preferably, in the switch circuit according to one aspect of the present invention, energy is accumulated in the first wire and the second wire, due to an electric current flowing through the first wire, the transistor circuit, and the second wire while the first main transistor is ON, and the energy accumulated in the first wire and the second wire is consumed, due to an electric current flowing through the first wire, the first surge protection device, and the second wire when the first main transistor is turned off.

(9) Preferably, in the switch circuit according to one aspect of the present invention, a positive electrode of a first electric storage unit is connected to the one end of the transistor circuit via the first wire, and a positive electrode of a second electric storage unit is connected to the other end of the transistor circuit via the second wire.

(10) Preferably, in the switch circuit according to one aspect of the present invention, the sub transistor includes: a third electrode that is connected to the second electrode of the first main transistor; a fourth electrode that is connected to the control electrode of the first main transistor; and a second control electrode, the sub transistor is turned on if a voltage at the second control electrode that takes a potential at the third electrode as a reference is equal to or greater than a predetermined voltage, and the switch circuit further includes: a resistor that is connected between the third electrode and the second control electrode of the sub transistor; and a diode whose cathode is connected to the second control electrode of the sub transistor, and whose anode is grounded.

(11) According to one aspect of the present invention, a power supply system includes: the above-described switch circuit; and a first electric storage unit whose positive electrode is connected to the one end of the transistor circuit via the first wire; and a second electric storage unit whose positive electrode is connected to the other end of the transistor circuit via the second wire.

According to one aspect, one of the first and second electric storage units supplies electric power to the other electric storage unit via the switch circuit, and the other electric storage unit is charged. In the switch circuit, the sub transistor is provided, and thus the first main transistor generates a small amount of heat when the first main transistor is turned on.

Detail of Embodiments of the Invention

Hereinafter, specific examples of the switch circuit and the power supply system according to embodiments of the present invention will be described with reference to the drawings. Note that the present invention is defined by the claims without being limited to these examples, and is intended to encompass all modifications within the claims and in the meaning equivalent to the claims.

Embodiment 1

FIG. 1 is a schematic diagram illustrating a configuration of a power supply system 100 according to Embodiment 1. The power supply system 100 is installed in a vehicle. The power supply system 100 includes a switch circuit 110 with a surge protection function. In the example of FIG. 1, the switch circuit 110 with a surge protection function is provided with paths PS1 and PS2, a first main transistor Tr1, a second main transistor Tr2, a sub transistor Tr3, and a first surge protection device 1.

The paths PS1 and PS2 are connected in parallel to each other. The first main transistor Tr1 and the second main transistor Tr2 are provided on the path PS1, and are connected in series to each other. The first main transistor Tr1 and the second main transistor Tr2 are N-channel FETs, and their forward directions are opposite to each other.

The first main transistor Tr1 is provided with a drain electrode (first electrode), a source electrode (second electrode), and a gate electrode (control electrode). The first main transistor Tr1 switches conduction between the drain electrode and the source electrode on/off depending on a control voltage between the gate electrode and the source electrode. The forward direction of the first main transistor Tr1 is a direction from the drain electrode toward the source electrode. Accordingly, the drain electrode is an electrode of the first main transistor Tr1 that is located on the upstream side in the forward direction. The second main transistor Tr2 has the same configuration as that of the first main transistor Tr1. The first main transistor Tr1 and the second main transistor Tr2 function as transistor circuits.

In each of the first main transistor Tr1 and the second main transistor Tr2, an electric current can flow between the drain electrode and the source electrode if the voltage at the gate electrode that takes the potential at the source electrode as a reference is equal to or greater than a predetermined positive voltage. At this time, the first main transistor Tr1 and the second main transistor Tr2 are both ON. The higher the voltage at the gate electrode that takes the potential at the source electrode as a reference, the lower the resistance value between the drain electrode and the source electrode. Furthermore, in each of the first main transistor Tr1 and the second main transistor Tr2, no electric current flows between the drain electrode and the source electrode if the voltage at the gate electrode that takes the potential at the source electrode as a reference is lower than the predetermined positive voltage. At this time, the first main transistor Tr1 and the second main transistor Tr2 are both OFF. The predetermined voltage of the first main transistor Tr1 is substantially equal to the predetermined voltage of the second main transistor Tr2.

The source electrodes of the first main transistor Tr1 and the second main transistor Tr2 are connected to each other, and the gate electrodes of the first main transistor Tr1 and the second main transistor Tr2 are connected in common to an output terminal 21 of a driving circuit 2 via respective gate resistors R1 and R2. The gate resistors R1 and R2 can respectively suppress, for example, oscillation of voltages that are applied to the gate electrodes of the first main transistor Tr1 and the second main transistor Tr2.

Furthermore, in the example of FIG. 1, diodes D1 and D2 are respectively connected in parallel to the first main transistor Tr1 and the second main transistor Tr2. The forward direction of the diode D1 is opposite to the forward direction of the first main transistor Tr1, and the forward direction of the diode D2 is opposite to the forward direction of the second main transistor Tr2. The first main transistor Tr1 and the second main transistor Tr2, and the diodes D1 and D2 constitute a so-called bi-directional switch. The diodes D1 and D2 are respectively parasitic diodes of the first main transistor Tr1 and the second main transistor Tr2. The cathodes of the diodes D1 and D2 are respectively connected to the drain electrodes of the first main transistor Tr1 and the second main transistor Tr2, and the anodes of the diodes D1 and D2 are respectively connected to the source electrodes of the first main transistor Tr1 and the second main transistor Tr2. Accordingly, since the anodes of the diodes D1 and D2 are connected to each other, no electric current will flow through the diodes D1 and D2 when the first main transistor Tr1 and the second main transistor Tr2 are OFF.

The sub transistor Tr3 is an NPN bipolar transistor. The sub transistor Tr3 is provided between the gate electrodes and the source electrodes of the first main transistor Tr1 and the second main transistor Tr2. In the example of FIG. 1, a collector electrode of the sub transistor Tr3 is connected to the gate electrodes of the first main transistor Tr1 and the second main transistor Tr2 via the gate resistors R1 and R2, and an emitter electrode of the sub transistor Tr3 is connected to the source electrodes of the first main transistor Tr1 and the second main transistor Tr2.

A resistor R3 is provided between a base electrode and the emitter electrode of the sub transistor Tr3. Furthermore, the base electrode of the sub transistor Tr3 is grounded via a resistor R4 and a diode D3. The forward direction of the diode D3 is a direction toward the base electrode of the sub transistor Tr3. Accordingly, the base electrode of the sub transistor Tr3 is connected to one end of the resistor R4, the cathode of the diode D3 is connected to the other end of the resistor R4, and the anode of the diode D3 is grounded.

In the sub transistor Tr3, an electric current can flow between the collector electrode and the emitter electrode if the voltage at its base electrode that takes the potential at its emitter electrode as a reference is equal to or greater than a predetermined positive voltage. At this time, the sub transistor Tr3 is ON. The higher the voltage at the base electrode that takes the potential at the emitter electrode as a reference, the smaller the resistance value between the collector electrode and the emitter electrode. Furthermore, in the sub transistor Tr3, no electric current flows between the collector electrode and the emitter electrode if the voltage at the base electrode that takes the potential at the emitter electrode as a reference is lower than the predetermined positive voltage. At this time, the sub transistor Tr3 is OFF. The sub transistor Tr3 is turned on or off depending on the voltage at the base electrode that takes the potential at the emitter electrode as a reference.

The predetermined voltage at which the sub transistor Tr3 is turned on and off is sufficiently lower than the predetermined voltage at which the first main transistor Tr1 is turned on and off, and is sufficiently lower than the predetermined voltage at which the second main transistor Tr2 is turned on and off.

As will be described later, the sub transistor Tr3 is turned on when the first main transistor Tr1 and the second main transistor Tr2 are turned off. More specifically, the sub transistor Tr3 is turned on during a period from the start to the end of turning off of the first main transistor Tr1 and the second main transistor Tr2. Furthermore, the speed at which the transistor Tr3 is turned on is higher than the speed at which the first main transistor Tr1 and the second main transistor Tr2 are turned off if no sub transistor Tr3 were provided.

The driving circuit 2 operates upon receiving a supply voltage from a DC power supply E1. For example, upon receiving a switch signal from the outside, the driving circuit 2 outputs a control voltage to the gate electrodes of the first main transistor Tr1 and the second main transistor Tr2. Accordingly, the first main transistor Tr1 and the second main transistor Tr2 are switched on/off.

The driving circuit 2 is grounded. The driving circuit 2 raises, with respect to each of the first main transistor Tr1 and the second main transistor Tr2, the voltage at the gate electrode that takes the ground potential as a reference, increasing the voltage at the gate electrode that takes the potential at the source electrode as a reference. Accordingly, the first main transistor Tr1 and the second main transistor Tr2 are turned on. Furthermore, the driving circuit 2 lowers, with respect to each of the first main transistor Tr1 and the second main transistor Tr2, the voltage at the gate electrode that takes the ground potential as a reference, decreasing the voltage at the gate electrode that takes the potential at the source electrode as a reference. Accordingly, the first main transistor Tr1 and the second main transistor Tr2 are turned off. The driving circuit 2 turns the first main transistor Tr1 and the second main transistor Tr2 on and off at the same time. Here, "at the same time" means not only a situation in which the timings at which turning on or off is performed completely match each other, but also a situation in which the timings at which turning on or off is performed substantially match each other.

The first surge protection device 1 is provided on a path PS2, and is connected in parallel to the series circuit of the first main transistor Tr1 and the second main transistor Tr2. The first surge protection device 1 is a so-called surge absorber, which is an element that lets an electric current flow if a voltage applied to the first surge protection device 1 exceeds a predetermined value (hereinafter, referred to also as "breakdown voltage"). For example, a semiconductor surge absorber (silicon surge absorber), a microgap surge absorber, an arrester, or a varistor may be used as the first surge protection device 1. The breakdown voltage of the first surge protection device 1 is about 18 [V], for example. The voltage between both ends of the first surge protection device 1 is kept at a voltage equal to or lower than the breakdown voltage. The breakdown voltage is greater than a difference value between the terminal voltages of a first electric storage unit 31 and the second electric storage unit 32.

As another configuration of the first surge protection device 1, it is conceivable that two Zener diodes are connected in series to each other. In this case, the cathode of one Zener diode is connected to the cathode of the other Zener diode, or the anode of one Zener diode is connected to the anode of the other Zener diode. The breakdown voltages of the two Zener diodes are substantially equal to each other.

In the example of FIG. 1, a positive electrode of the first electric storage unit 31 is connected to the drain electrode of the first main transistor Tr1, and a positive electrode of the second electric storage unit 32 is connected to the drain electrode of the second main transistor Tr2. Negative electrodes of the first electric storage unit 31 and the second electric storage unit 32 are both grounded. The voltages of the first electric storage unit 31 and the second electric storage unit 32 are about 14 [V] when they are fully charged, for example. The first electric storage unit 31 and the second electric storage unit 32 are both installed in the vehicle, for example.

In the example of FIG. 1, the drain electrode of the first main transistor Tr1 is connected to a connector 41 to which one end of a wire L1 is connected. The other end of the wire L1 is connected to the positive electrode of the first electric storage unit 31. Similarly, the drain electrode of the second main transistor Tr2 is connected to a connector 42 to which one end of a wire L2 is connected. The other end of the wire L2 is connected to the positive electrode of the second electric storage unit 32. The wires L1 and L2 are, for example, wire harnesses. The example of FIG. 1 shows that the wires L1 and L2 have wire resistances and wire inductances that are equivalent to each other. "Wire resistance" is a resistance component of the wire L1 or the wire L2, and "wire inductance" is an inductive component of the wire L1 or the wire L2.

Furthermore, multiple loads (not shown) are provided in the vehicle, and are connected to, for example, the connector 41 or the connector 42. These loads receive a supply voltage from at least either of the first electric storage unit 31 and the second electric storage unit 32.

Specifically, when the first main transistor Tr1 and the second main transistor Tr2 are ON, the above-described multiple loads receive a supply voltage from the first electric storage unit 31 or the second electric storage unit 32. Furthermore, when the first main transistor Tr1 and the second main transistor Tr2 are ON, either one of the first electric storage unit 31 and the second electric storage unit 32 supplies electric power to the other electric storage unit to charge the other electric storage unit. When the first main transistor Tr1 and the second main transistor Tr2 are OFF, a load connected to the connector 41 is supplied with electric power from the first electric storage unit 31, and a load connected to the connector 42 is supplied with electric power from the second electric storage unit 32.

The following will describe an operation. Here, a typical case will be described in which an electric current flows from the connector 41 to the connector 42. If the first main transistor Tr1 and the second main transistor Tr2 are ON, and the voltage of the first electric storage unit 31 is higher than the voltage of the second electric storage unit 32, then an electric current will flow from the first electric storage unit 31 to the second electric storage unit 32 via the wire L1, the first main transistor Tr1, the second main transistor Tr2, and the wire L2. Accordingly, the second electric storage unit 32 is charged by the first electric storage unit 31.

The first main transistor Tr1 and the second main transistor Tr2 are turned off to interrupt the conduction between the first electric storage unit 31 and the second electric storage unit 32.

Figure 2:
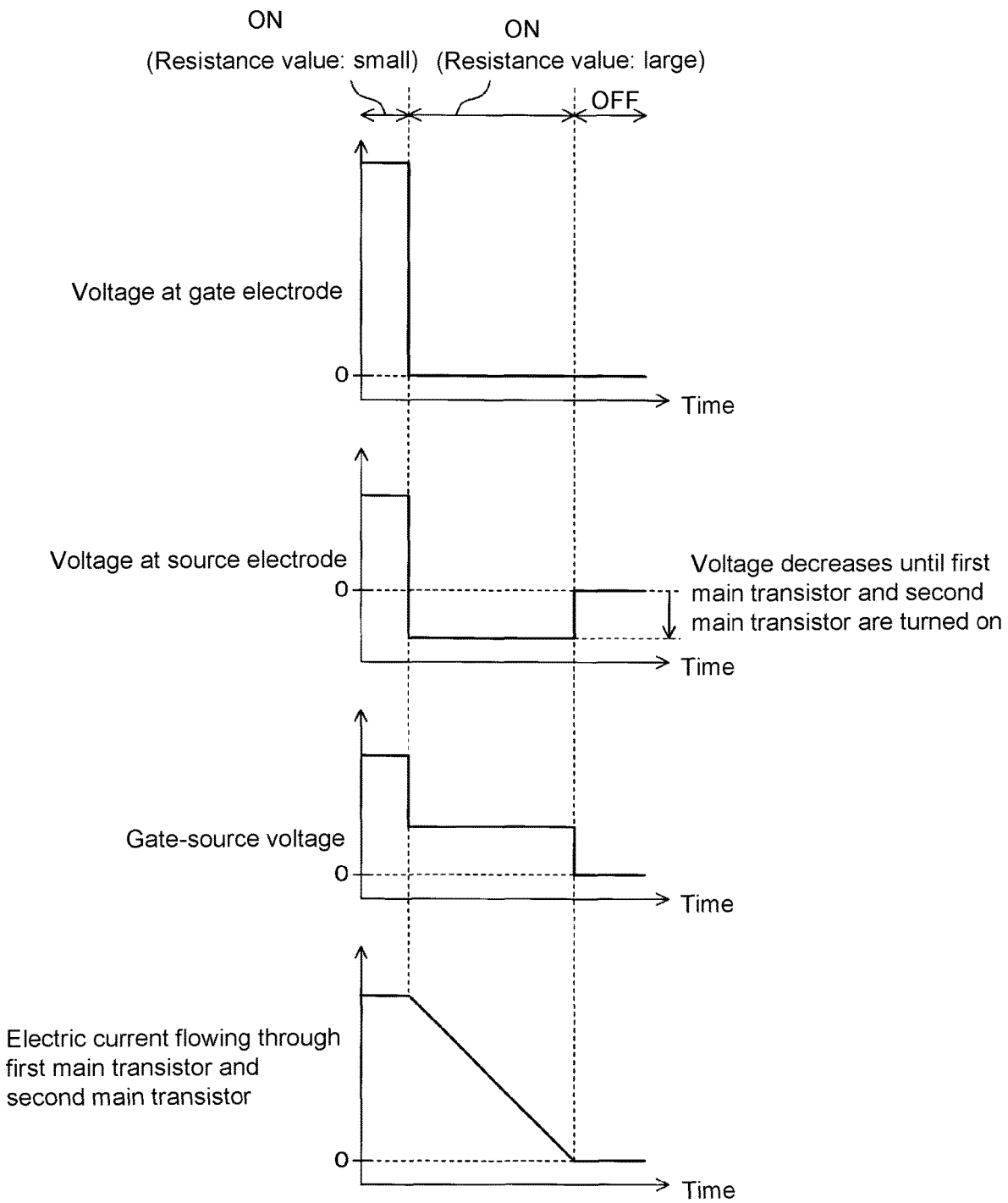
FIG. 2 is a diagram illustrating an operation of a switch circuit in which no first surge protection device and no sub transistor is provided.

FIG. 2 is a diagram illustrating an operation of a switch circuit 110 in which neither a first surge protection device 1 nor a sub transistor Tr3 is provided. FIG. 2 shows graphs of voltages at gate electrodes and source electrodes of a first main transistor Tr1 and a second main transistor Tr2, a graph of the gate-source voltages of the first main transistor Tr1 and the second main transistor Tr2, and a graph of an electric current flowing through the first main transistor Tr1 and the second main transistor Tr2. In these graphs, the horizontal axes denote time. In FIG. 2, the voltages at the gate electrodes and the source electrodes shown are voltages that take the ground potential as a reference. The gate-source voltages are voltages at their gates that take the potential at their source electrodes as a reference.

The driving circuit 2 adjusts the voltages at the gate electrodes of the first main transistor Tr1 and the second main transistor Tr2 to a set voltage that was set in advance, to turn on the first main transistor Tr1 and the second main transistor Tr2. Here, the voltages at their source electrodes are substantially equal to the terminal voltage of the first electric storage unit 31 that takes the ground potential as a reference. Furthermore, the gate-source voltages are sufficiently high so that the resistance values in the first main transistor Tr1 and the second main transistor Tr2 are small, and an electric current flows from the first electric storage unit 31 to the second electric storage unit 32 via the wire L1, the first main transistor Tr1, the second main transistor Tr2, and the wire L2. Energy is accumulated in the wire inductances of the wires L1 and L2 as long as the first main transistor Tr1 and the second main transistor Tr2 are ON.

The driving circuit 2 adjusts the voltages at the gate electrodes of the first main transistor Tr1 and the second main transistor Tr2 from the set voltage to, for example, zero [V] to turn off the first main transistor Tr1 and the second main transistor Tr2. In this case, the wire inductance of the wire L1 raises the voltage of the connector 41 that takes the ground potential as a reference to keep the magnitude of the electric current flowing through the wire L1. Also, when the voltages at the gate electrodes are adjusted from the set voltage to zero [V], the wire inductance of the wire L2 lowers the voltage of the connector 42 that takes the ground potential as a reference to keep the magnitude of the electric current flowing through the wire L2. Accordingly, the voltages at the source electrodes as well decrease.

The wire inductance of the wire L2 lowers the voltages at the source electrodes until the gate-source voltages become equal to or greater than a predetermined positive voltage. Accordingly, the first main transistor Tr1 and the second main transistor Tr2 remain ON. As a result, the electric current continues to flow through the first main transistor Tr1 and the second main transistor Tr2, and the energy accumulated in the wire inductances of the wires L1 and L2 is discharged. Until the energy accumulated in the wire inductance of the wire L2 becomes zero, the gate-source voltages are kept at a predetermined voltage, and the electric current flowing through the first main transistor Tr1 and the second main transistor Tr2 decreases at a constant slope. When the energy accumulated in the wire inductance in the wire L2 have become zero, the voltages at the source electrodes becomes zero [V]. Accordingly, the gate-source voltages become zero [V], and the first main transistor Tr1 and the second main transistor Tr2 are turned off. Of course, when the first main transistor Tr1 and the second main transistor Tr2 are OFF, the electric current that flows through the first main transistor Tr1 and the second main transistor Tr2 is zero [A].

While the energy is discharged from the wire inductance of the wire L2, the gate-source voltages are low, and thus the drain-source resistances of the first main transistor Tr1 and the second main transistor Tr2 are large. Furthermore, a large current, for example, a current that exceeds 100 [A] flows through the first main transistor Tr1 and the second main transistor Tr2. Accordingly, while the energy is discharged from the wire inductance of the wire L2, the first main transistor Tr1 and the second main transistor Tr2 consume a large amount of power, and the temperatures of the first main transistor Tr1 and the second main transistor Tr2 drastically increase. If the temperatures of the first main transistor Tr1 and the second main transistor Tr2 are high, then there is the risk that the first main transistor Tr1 and the second main transistor Tr2 may malfunction.

Figure 3:
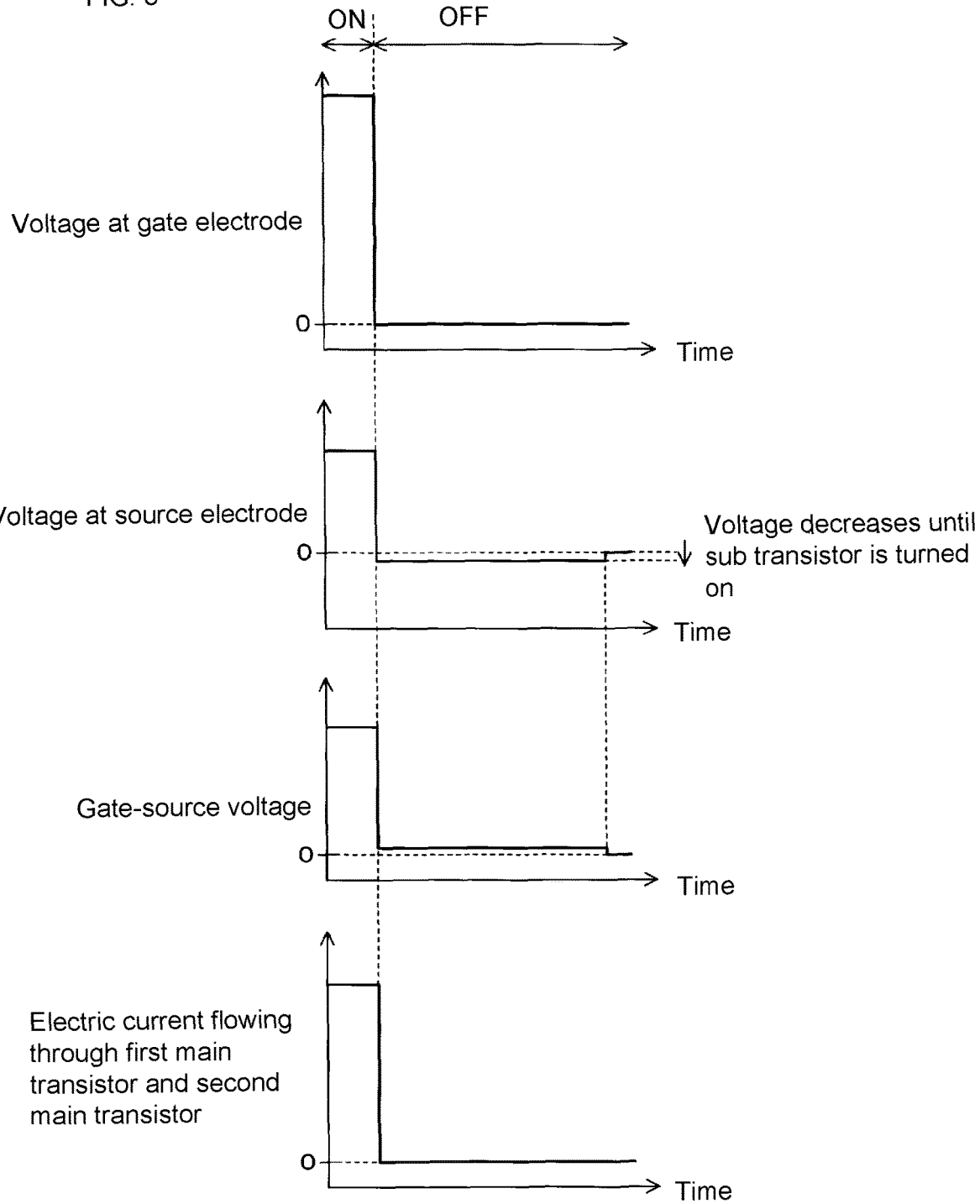
FIG. 3 is a diagram illustrating an operation of a switch circuit that is provided with a first surge protection device and a sub transistor.

FIG. 3 is a diagram illustrating an operation of the switch circuit 110 that is provided with the first surge protection device 1 and the sub transistor Tr3. Similar to FIG. 2, FIG. 3 shows graphs of voltages at the gate electrodes and the source electrodes of the first main transistor Tr1 and the second main transistor Tr2, a graph of the gate-source voltages of the first main transistor Tr1 and the second main transistor Tr2, and a graph of an electric current flowing through the first main transistor Tr1 and the second main transistor Tr2.

Similar to the case where neither a first surge protection device 1 nor a sub transistor Tr3 is provided, the driving circuit 2 adjusts the voltages at the gate electrodes of the first main transistor Tr1 and the second main transistor Tr2 to a set voltage, to turn on the first main transistor Tr1 and the second main transistor Tr2. Energy is accumulated in the wire inductances of the wires L1 and L2 as long as the first main transistor Tr1 and the second main transistor Tr2 are ON.

Furthermore, when the first main transistor Tr1 and the second main transistor Tr2 are ON, the voltage at the emitter electrode of the sub transistor Tr3 that takes the ground potential as a reference is substantially equal to the terminal voltage of the first electric storage unit 31 that takes the ground potential as a reference, and thus is a positive voltage. Accordingly, due to the behavior of the diode D3, no electric current will flow through the resistor R3. As a result, the voltage at the base electrode of the sub transistor Tr3 that takes the potential at its emitter electrode as a reference is zero [V], and thus is lower than the predetermined positive voltage. Accordingly, the sub transistor Tr3 is OFF when the first main transistor Tr1 and the second main transistor Tr2 are ON.

If the driving circuit 2 adjusts the voltages at the gate electrodes of the first main transistor Tr1 and the second main transistor Tr2 from the set voltage to, for example, zero [V] to turn off the first main transistor Tr1 and the second main transistor Tr2, then the wire inductance of the wire L1 raises the voltage of the connector 41 that takes the ground potential as a reference, and the wire inductance of the wire L2 lowers the voltage of the connector 42 that takes the ground potential as a reference, so that the voltages at the source electrodes of the first main transistor Tr1 and the second main transistor Tr2 are reduced.

When the voltages at the source electrodes are reduced, the voltage at the emitter electrode of the sub transistor Tr3 that takes the ground potential as a reference decreases. When the voltage at the emitter electrode of the sub transistor Tr3 that takes the ground potential as a reference has become a negative voltage, and the absolute value of this voltage is equal to or greater than a predetermined value, then an electric current flows through the diode D3, and resistors R4 and R3 in this order, and a voltage drop occurs in the resistor R3. Accordingly, there is a difference in voltage between the emitter electrode and the base electrode of the sub transistor Tr3. Thereafter, an electric current flowing through the resistor R3 increases and the size of the voltage drop at the resistor R3 increases, as the voltage decreases at the emitter electrode of the sub transistor Tr3 that takes the ground potential as a reference. As a result, the voltage at the base electrode of the sub transistor Tr3 that takes the potential at its emitter electrode as a reference increases.

As described above, the predetermined voltage at which the sub transistor Tr3 is turned off is sufficiently lower than the predetermined voltages at which the first main transistor Tr1 and the second main transistor Tr2 are respectively turned off. Accordingly, if the voltages at their source electrodes are reduced, then the sub transistor Tr3 is turned on first. Then, an electric current flows from the output terminal 21 of the driving circuit 2 to the sub transistor Tr3, the diode D2, and the wire L2 in this order, and the energy accumulated in the wire inductance of the wire L2 is discharged. Since the voltage at the base electrode of the sub transistor Tr3 that takes the potential at its emitter electrode as a reference is low while the energy accumulated in the wire inductance of the wire L2 is discharged, the collector-emitter resistance value of the sub transistor Tr3 is large. However, the electric current flowing from the output terminal 21 of the driving circuit 2 to the sub transistor Tr3 is small, and thus the sub transistor Tr3 consumes a small amount of power, and an increase in the temperature of the sub transistor Tr3 is small.

Because the gate-source voltages are very low while the sub transistor Tr3 is ON, the first main transistor Tr1 and the second main transistor Tr2 remain OFF, and the electric current flowing through the first main transistor Tr1 and the second main transistor Tr2 is zero [A]. When the energy accumulated in the wire inductance of the wire L2 has become zero, the voltages at the source electrodes become zero [V], and the gate-source voltages become zero [V]. Accordingly, the first main transistor Tr1 and the second main transistor Tr2 are not turned on, and the first main transistor Tr1 and the second main transistor Tr2 remain OFF. Furthermore, when the voltages at the source electrodes have become zero [V], then the voltage at the emitter electrode of the sub transistor Tr3 that takes the ground potential as a reference becomes zero [V], and thus the sub transistor Tr3 is turned off.

Figure 4:
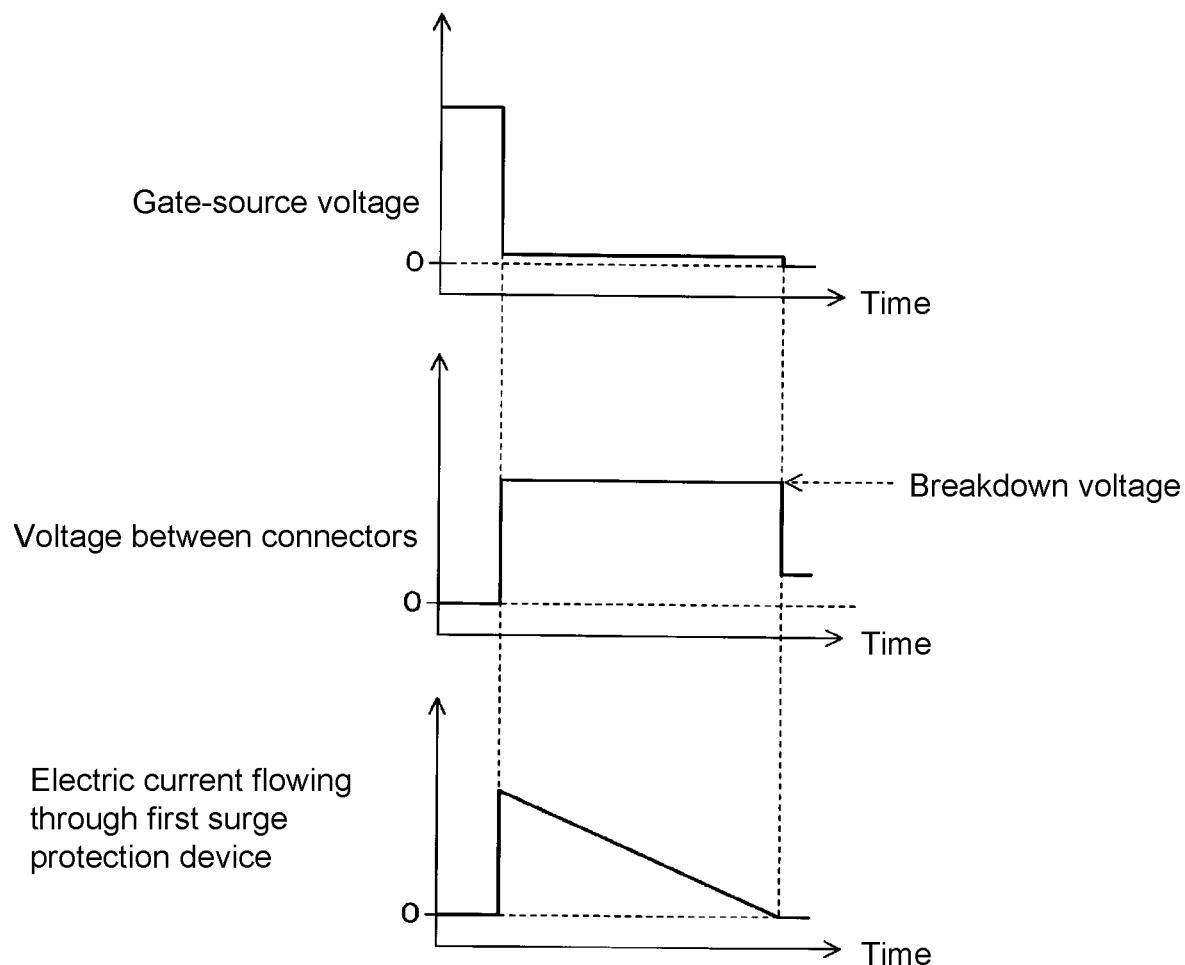
FIG. 4 is another diagram illustrating an operation of the switch circuit that is provided with a first surge protection device and a sub transistor.

FIG. 4 is another diagram illustrating an operation of the switch circuit 110 that is provided with the first surge protection device 1 and the sub transistor Tr3. FIG. 4 shows the graph of the gate-source voltages shown in FIG. 3. FIG. 4 further shows a graph of the voltage between the connectors 41 and 42, and a graph of the electric current flowing through the first surge protection device 1. In these graphs as well, the horizontal axes denote time. The voltage between the connectors 41 and 42 is a voltage of the connector 41 that takes the potential at the connector 42 as a reference.

The voltage between the connectors 41 and 42 is almost zero [V] as long as the gate-source voltages are high, and the first main transistor Tr1 and the second main transistor Tr2 are ON. When the gate-source voltages are reduced and the first main transistor Tr1 and the second main transistor Tr2 are turned off, as described above, the voltage of the connector 41 that takes the ground potential as a reference increases, and the voltage of the connector 42 that takes the ground potential as a reference decreases. Accordingly, the voltage between the connectors 41 and 42 increases. When the voltage between the connectors 41 and 42 has reached a breakdown voltage of the first surge protection device 1, an electric current flows through the wire L1, the first surge protection device 1, and the wire L2 in this order, and the energy accumulated in the wire inductances of the wires L1 and L2 is consumed. Until the energy accumulated in the wire inductances of the wires L1 and L2 becomes zero, the voltage between the connectors 41 and 42 is kept at the breakdown voltage, and the electric current flowing through the first surge protection device 1 decreases at a constant slope. When the energy accumulated in the wire inductances of the wires L1 and L2 has become zero, the voltage between the connectors 41 and 42 is kept at a voltage that is obtained by subtracting the terminal voltage of the second electric storage unit 32 from the terminal voltage of the first electric storage unit 31.

When an electric current flows from the connector 42 to the connector 41, both of the switch circuits 110 with and without the first surge protection device 1 and the sub transistor Tr3 function in the same manner as in the case where an electric current flows from the connector 42 to the connector 41.

If the first main transistor Tr1 and the second main transistor Tr2 are ON, and the voltage of the second electric storage unit 32 is higher than the voltage of the first electric storage unit 31, then an electric current will flow from the second electric storage unit 32 to the first electric storage unit 31 via the wire L2, the second main transistor Tr2, the first main transistor Tr1, and the wire L1. Accordingly, the first electric storage unit 31 is charged by the second electric storage unit 32.

The following will describe differences, in the switch circuit 110 in which neither a first surge protection device 1 nor a sub transistor Tr3 is provided, between its operation when an electric current flows from the connector 42 to the connector 41, and its operation when an electric current flows from the connector 41 to the connector 42.

If the driving circuit 2 turns the first main transistor Tr1 and the second main transistor Tr2 on so that an electric current flows from the connector 42 to the connector 41, then the voltages at the source electrodes are substantially equal to the terminal voltage of the second electric storage unit 32 that takes the ground potential as a reference. Energy is accumulated in the wire inductances of the wires L1 and L2 as long as the first main transistor Tr1 and the second main transistor Tr2 are ON.

If the driving circuit 2 adjusts the voltages at the gate electrodes of the first main transistor Tr1 and the second main transistor Tr2 from the set voltage to, for example, zero [V] to turn off the first main transistor Tr1 and the second main transistor Tr2, then the wire inductance of the wire L2 raises the voltage of the connector 42 that takes the ground potential as a reference to keep the magnitude of the electric current flowing through the wire L2. Also, when the voltages at the gate electrodes are adjusted from the set voltage to zero [V], the wire inductance of the wire L1 lowers the voltage of the connector 41 that takes the ground potential as a reference to keep the magnitude of the electric current flowing through the wire L1. Accordingly, the voltages at the source electrodes as well decrease.

The wire inductance of the wire L1 lowers the voltages at the source electrodes until the gate-source voltages become equal to or greater than a predetermined positive voltage. Accordingly, the first main transistor Tr1 and the second main transistor Tr2 remain ON. As a result, the electric current continues to flow through the first main transistor Tr1 and the second main transistor Tr2, and the energy accumulated in the wire inductances of the wires L1 and L2 is discharged. Until the energy accumulated in the wire inductance of the wire L1 becomes zero, the gate-source voltages are kept at a predetermined voltage, and the electric current flowing through the first main transistor Tr1 and the second main transistor Tr2 decreases at a constant slope. When the energy accumulated in the wire inductance of the wire L1 has become zero, the voltages at the source electrodes become zero [V]. Accordingly, the gate-source voltages become zero [V], and the first main transistor Tr1 and the second main transistor Tr2 are turned off.

While the energy is discharged from the wire inductance of the wire L1, the first main transistor Tr1 and the second main transistor Tr2 consume a large amount of power, and the temperatures of the first main transistor Tr1 and the second main transistor Tr2 drastically increase. If the temperatures of the first main transistor Tr1 and the second main transistor Tr2 are high, then there is the risk that the first main transistor Tr1 and the second main transistor Tr2 may malfunction.

The following will describe differences, in the switch circuit 110 that is provided with the first surge protection device 1 and the sub transistor Tr3, between its operation when an electric current flows from the connector 42 to the connector 41, and its operation when an electric current flows from the connector 41 to the connector 42.

When the first main transistor Tr1 and the second main transistor Tr2 are ON, the voltage at the emitter electrode of the sub transistor Tr3 that takes the ground potential as a reference is substantially equal to the terminal voltage of the second electric storage unit 32 that takes the ground potential as a reference, and thus is a positive voltage. Accordingly, no electric current flows through the resistor R3, and the voltage at the base electrode of the sub transistor Tr3 that takes the potential at its emitter electrode as a reference is zero [V], and thus is lower than a predetermined positive voltage. As a result, when the first main transistor Tr1 and the second main transistor Tr2 are ON, the sub transistor Tr3 is OFF.

If the driving circuit 2 adjusts the voltages at the gate electrodes of the first main transistor Tr1 and the second main transistor Tr2 from the set voltage to, for example, zero [V] to turn off the first main transistor Tr1 and the second main transistor Tr2, then the wire inductance of the wire L2 raises the voltage of the connector 42 that takes the ground potential as a reference, and the wire inductance of the wire L1 lowers the voltage of the connector 41 that takes the ground potential as a reference, so that the voltages at the source electrodes are reduced. When the voltages at the source electrodes are reduced, the voltage at the emitter electrode of the sub transistor Tr3 that takes the ground potential as a reference decreases, and the sub transistor Tr3 is turned on.

Then, an electric current flows from the output terminal 21 of the driving circuit 2 to the sub transistor Tr3, the diode D1, and the wire L1 in this order, and the energy accumulated in the wire inductance of the wire L1 is discharged. While the energy accumulated in the wire inductance of the wire L1 is discharged, the sub transistor Tr3 consumes a small amount of power, and an increase in the temperature of the sub transistor Tr3 is small.

Because the gate-source voltages are very low while the sub transistor Tr3 is ON, the first main transistor Tr1 and the second main transistor Tr2 remain OFF. After the energy accumulated in the wire inductance of the wire L1 has become zero, the gate-source voltages becomes zero [V], and the first main transistor Tr1 and the second main transistor Tr2 remain OFF. Furthermore, when the voltages at the source electrodes have become zero [V], then the sub transistor Tr3 is turned off.

When the gate-source voltages decrease, and the first main transistor Tr1 and the second main transistor Tr2 are turned off, then the voltage of the connector 42 that takes the ground potential as a reference increases, and the voltage of the connector 41 that takes the ground potential as a reference decreases, as described above. Accordingly, the absolute value of the voltage between the connectors 41 and 42 increases. When the voltage between the connectors 41 and 42 has reached the breakdown voltage of the first surge protection device 1, an electric current flows through the wire L2, the first surge protection device 1, and the wire L1 in this order, and the energy accumulated in the wire inductances of the wires L1 and L2 is consumed. Until the energy accumulated in the wire inductances of the wires L1 and L2 becomes zero, the absolute value of the voltage between the connectors 41 and 42 is kept at the breakdown voltage, and the electric current flowing through the first surge protection device 1 decreases at a constant slope. When the energy accumulated in the wire inductances of the wires L1 and L2 has become zero, the absolute value of the voltage between the connectors 41 and 42 is kept at a voltage that is obtained by subtracting the terminal voltage of the first electric storage unit 31 from the terminal voltage of the second electric storage unit 32.

As described above, if the driving circuit 2 turns the first main transistor Tr1 and the second main transistor Tr2 off, then the sub transistor Tr3 is turned on, and thus the gate-source voltages are kept at a voltage lower than a predetermined voltage, and the first main transistor Tr1 and the second main transistor Tr2 remain OFF. As a result, the first main transistor Tr1 and the second main transistor Tr2 generate a small amount of heat when they are turned off. Furthermore, since the first surge protection device 1 is connected to the drain electrodes of the first main transistor Tr1 and the second main transistor Tr2, the voltages that are applied between the ends of the first main transistor Tr1 and the second main transistor Tr2 are respectively kept at voltages equal to or lower than their breakdown voltages.

Embodiment 2

In Embodiment 1, the pair of first main transistor Tr1 and second main transistor Tr2 are provided, but it is not necessary to provide both of the first main transistor Tr1 and the second main transistor Tr2. For example, if a load is provided in place of the second electric storage unit 32, then the second main transistor Tr2 is not needed.

The following will describe differences of Embodiment 2 from Embodiment 1. Configurations of Embodiment 2 other than those described hereinafter are the same as in Embodiment 1, and will thus be given the same reference numerals, and detailed descriptions thereof will be omitted.

Figure 5:
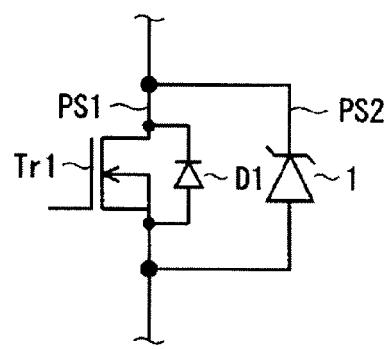
FIG. 5 is a schematic diagram illustrating part of a switch circuit according to Embodiment 2.

FIG. 5 is a schematic diagram illustrating part of a switch circuit 110 according to Embodiment 2. In the example of FIG. 5, a first main transistor Tr1 and a first surge protection device 1 are respectively provided on paths PS1 and PS2, and are connected in parallel to each other. Furthermore, in this case, the first surge protection device 1 does not need to be a bi-directional surge protection device but may be a one-directional surge protection device. When the voltage of the first surge protection device 1 (forward direction voltage of the first main transistor Tr1) exceeds a breakdown voltage, then the first surge protection device 1 is turned on. Note that the one-directional first surge protection device 1 may be connected in parallel to the first main transistor Tr1 and a second main transistor Tr2. The breakdown voltage is higher than the terminal voltage of the first electric storage unit 31. In Embodiment 2, the first main transistor Tr1 functions as a transistor circuit.

In the example of FIG. 5, the first surge protection device 1 includes a Zener diode, and the cathode and the anode of this Zener diode are respectively connected to the drain electrode and the source electrode of the first main transistor Tr1. In the first surge protection device 1, when the voltage at the cathode that takes the potential at the anode as a reference has become a breakdown voltage, then an electric current flows from the cathode to the anode to keep the drain-source voltage of the first main transistor Tr1 at a voltage equal to or lower than the breakdown voltage.

The drain electrode of the first main transistor Tr1 is connected to a connector 41, and the source electrode of the first main transistor Tr1 is connected to a connector 42 and an emitter electrode of a sub transistor Tr3.

The switch circuit 110 of Embodiment 2 that has the above-described configuration has the same effects as the switch circuit 110 of Embodiment 1.

Note that in the switch circuit 110 of Embodiment 2, no electric current flows from the connector 42 to the connector 41. Furthermore, the switch circuit 110 of Embodiment 2 is not provided with a second main transistor Tr2 and a resistor R2.

Embodiment 3

In Embodiment 2, the number of first main transistors Tr1 may also be 2 or more.

The following will describe differences of Embodiment 3 from Embodiment 2. Configurations of Embodiment 3 other than those described hereinafter are the same as in Embodiment 2, and will thus be given the same reference numerals, and detailed descriptions thereof will be omitted.

Figure 6:
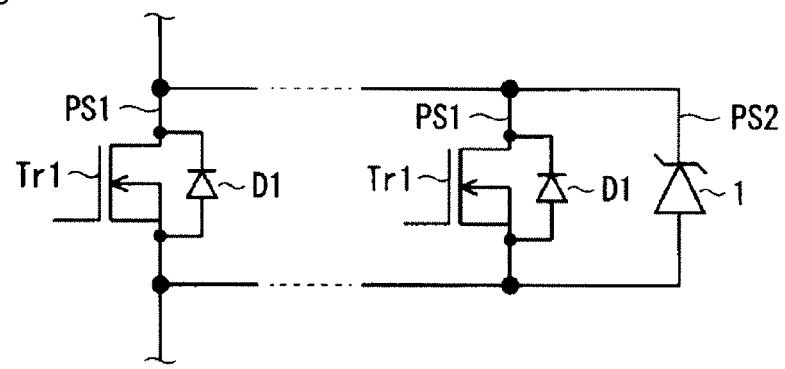
FIG. 6 is a schematic diagram illustrating part of a switch circuit according to Embodiment 3.

FIG. 6 is a schematic diagram illustrating part of a switch circuit 110 according to Embodiment 3. A plurality of paths PS1 are provided, and are connected in parallel to a path PS2. A first main transistor Tr1 is provided on each path PS1. In other words, the plurality of first main transistors Tr1 are connected in parallel to each other. A first surge protection device 1 is connected in parallel to the plurality of first main transistors Tr1. The number of first surge protection devices 1 is, for example, less than the number of first main transistors Tr1, and is one in the example of FIG. 6. In Embodiment 3, the plurality of first main transistors Tr1 function as transistor circuits.

An output terminal 21 of a driving circuit 2 is connected to the gate electrodes of the plurality of first main transistors Tr1 via a resistor R1. The driving circuit 2 turns the plurality of first main transistors Tr1 on and off at the same time. Here, "at the same time" means not only a situation in which the timings at which turning on or off is performed completely match each other, but also a situation in which the timings at which turning on or off is performed substantially match each other.

A diode D1 is connected between a drain electrode and a source electrode of each of the plurality of first main transistors Tr1.

The switch circuit 110 of Embodiment 3 that has the above-described configuration has the same effects as the switch circuit 110 of Embodiment 2.

In Embodiments 2 and 3, the first main transistors Tr1 are not limited to N-channel FETs, and may be NPN bipolar transistors, IGBTs (Insulated Gate Bipolar Transistors), or the like.

Embodiment 4

In Embodiment 1, the number of series circuits each constituted by a first main transistor Tr1 and a second main transistor Tr2 may also be 2 or more.

The following will describe differences of Embodiment 4 from Embodiment 1. Configurations of Embodiment 4 other than those described hereinafter are the same as in Embodiment 1, and will thus be given the same reference numerals, and detailed descriptions thereof will be omitted.

Figure 7:
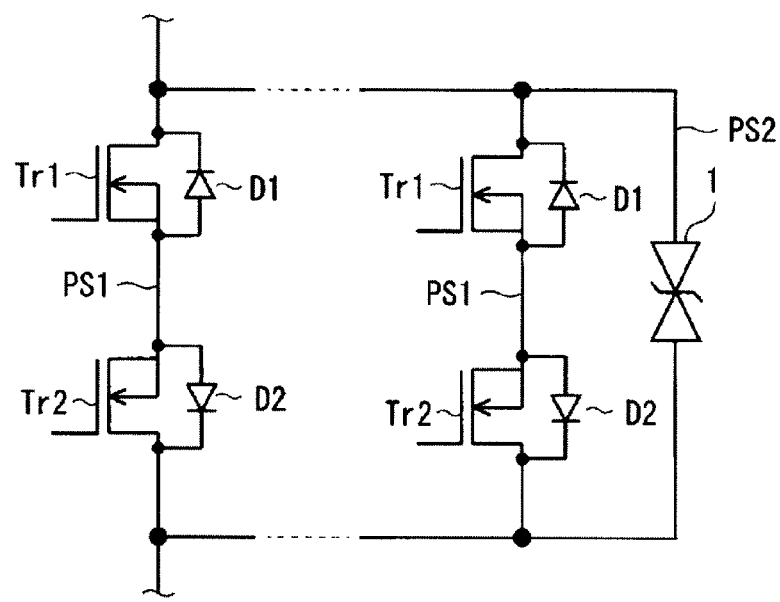
FIG. 7 is a schematic diagram illustrating part of a switch circuit according to Embodiment 4.

FIG. 7 is a schematic diagram illustrating part of a switch circuit 110 according to Embodiment 4. A plurality of paths PS1 are provided, and are connected in parallel to a path PS2. A first main transistor Tr1 and a second main transistor Tr2 that are connected in series to each other are provided on each path PS1. In other words, the plurality of series circuits each constituted by a first main transistor Tr1 and a second main transistor Tr2 are connected in parallel to each other. A first surge protection device 1 is connected in parallel to the plurality of series circuits. The number of first surge protection devices 1 is less than the number of series circuits, and is one in the example of FIG. 7. In Embodiment 4, the plurality of first main transistors Tr1 and the plurality of second main transistors Tr2 function as transistor circuits.

A diode D1 is connected between a drain electrode and a source electrode of each of the first main transistors Tr1. A diode D2 is connected between a drain electrode and a source electrode of each of the second main transistors Tr2. The source electrodes of the plurality of first main transistors Tr1 are connected to an emitter electrode of a sub transistor Tr3.

An output terminal 21 of a driving circuit 2 is connected to the gate electrodes of the plurality of first main transistors Tr1 via a resistor R1, and is connected to the gate electrodes of the plurality of second main transistors Tr2 via a resistor R2. The driving circuit 2 turns all the first main transistors Tr1 and all the second main transistor Tr2 on and off at the same time. Here, "at the same time" means not only a situation in which the timings at which turning on or off is performed completely match each other, but also a situation in which the timings at which turning on or off is performed substantially match each other.

The switch circuit 110 of Embodiment 4 that has the above-described configuration has the same effects as the switch circuit 110 of Embodiment 1.

Embodiment 5

In Embodiment 1, the numbers of first main transistors Tr1 and second main transistors Tr2 of are not limited to one.

The following will describe differences of Embodiment 5 from Embodiment 1. Configurations of Embodiment 5 other than those described hereinafter are the same as in Embodiment 1, and will thus be given the same reference numerals, and detailed descriptions thereof will be omitted.

Figure 8:
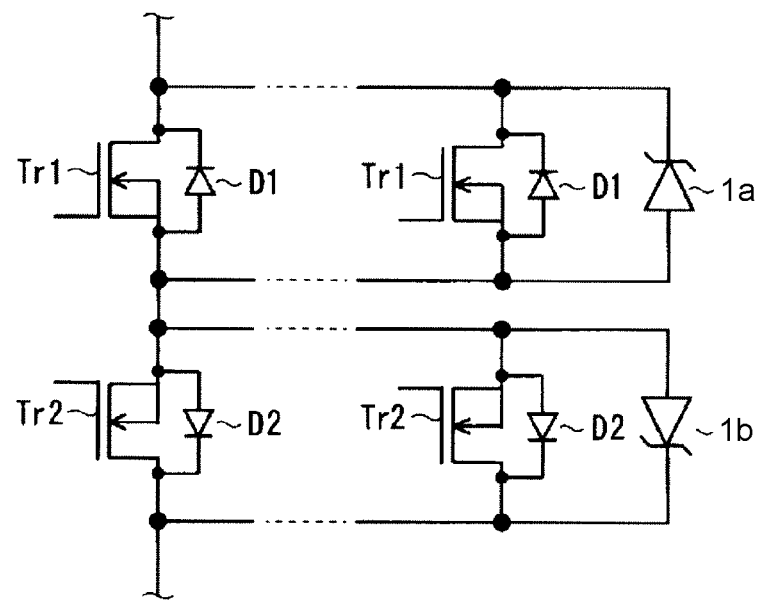
FIG. 8 is a schematic diagram illustrating part of a switch circuit according to Embodiment 5.

FIG. 8 is a schematic diagram illustrating part of a switch circuit 110 according to Embodiment 5. The switch circuit 110 includes a plurality of first main transistors Tr1 and a plurality of second main transistors Tr2. The plurality of first main transistors Tr1 are connected in parallel to each other, and the plurality of second main transistors Tr2 are connected in parallel to each other. A diode D1 is connected between a drain electrode and a source electrode of each of the first main transistors Tr1. A diode D2 is connected between a drain electrode and a source electrode of each of the second main transistors Tr2. In Embodiment 5, the plurality of first main transistors Tr1 and the plurality of second main transistors Tr2 function as transistor circuits.

A first surge protection device 1a is connected between the drain electrodes and the source electrodes of the first main transistors Tr1. In the example of FIG. 8, the first surge protection device 1a includes a Zener diode, and the cathode and the anode of the Zener diode are respectively connected to the drain electrodes and the source electrodes of the first main transistors Tr1.

Similarly, a first surge protection device 1b is connected between the drain electrodes and the source electrodes of the second main transistors Tr2. In the example of FIG. 8, the first surge protection device 1b also includes a Zener diode, and the cathode and the anode of the Zener diode are respectively connected to the drain electrodes and the source electrodes of the second main transistors Tr2.

In the Zener diode of the first surge protection device 1a, an electric current will flow from its cathode to its anode when the voltage at the cathode that takes the potential at the anode as a reference becomes a breakdown voltage. The electric current flows from the anode of the Zener diode of the first surge protection device 1a via at least one of the first surge protection device 1b and the plurality of diodes D2.

Similarly, in the Zener diode of the first surge protection device 1b, an electric current will flow from its cathode to its anode when the voltage at the cathode that takes the potential at the anode as a reference becomes a breakdown voltage. The electric current flows from the anode of the Zener diode of the first surge protection device 1b via at least one of the first surge protection device 1a and the plurality of diodes D1.

The breakdown voltages of the first surge protection devices 1a and 1b are greater than a difference value between the terminal voltages of the first electric storage unit 31 and the second electric storage unit 32.

A driving circuit 2 turns all the first main transistors Tr1 and all the second main transistor Tr2 on and off at the same time. Here, "at the same time" means not only a situation in which the timings at which turning on or off is performed completely match each other, but also a situation in which the timings at which turning on or off is performed substantially match each other.

The switch circuit 110 of Embodiment 5 that has the above-described configuration has the same effects as the switch circuit 110 of Embodiment 1.

Note that in Embodiment 5, the number of first main transistors Tr1 may be the same as or different from the number of the second main transistors Tr2. Furthermore, the number of first main transistors Tr1 may be 1, and the number of second main transistors Tr2 may be 2 or more. Furthermore, the number of second main transistors Tr2 may be 1, and the number of first main transistors Tr1 may be 2 or more.

Embodiment 6

If, as shown in FIG. 1, the first electric storage unit 31 and the second electric storage unit 32 are provided, then there is a possibility that an operator subjects the first electric storage unit 31 and the second electric storage unit 32 to erroneous connection. For example, the operator may connect the second electric storage unit 32 with its positive electrode and negative electrode inverted. That is, the negative electrode of the second electric storage unit 32 is connected to the connector 42, and the positive electrode of the second electric storage unit 32 is grounded. Hereinafter, such a state that the first electric storage unit 31 or the second electric storage unit 32 are connected with its positive electrode and negative electrode inverted is also referred to as "inverted connection state".

In this case, the sum of the voltage of the first electric storage unit 31 and the voltage of the second electric storage unit 32 is applied to the first surge protection device 1. For example, if the voltages of the first electric storage unit 31 and the second electric storage unit 32 are 14 [V], then a voltage of 28 [V] will be applied to the first surge protection device 1. Setting a breakdown voltage of the first surge protection device 1 that is greater than this sum makes it possible to prevent, even if the second electric storage unit 32 is erroneously connected, an electric current from flowing therethrough during the operation. However, an increase in the breakdown voltage of the first surge protection device 1 may lead to an increase in the voltages generated in the first main transistor Tr1 and the second main transistor Tr2, and thus is not preferable.

Therefore, Embodiment 6 is designed to prevent an electric current from flowing due to erroneous connection while suppressing the amount of an increase in the breakdown voltage of the first surge protection device 1.

The following will describe differences of Embodiment 6 from Embodiment 1. Configurations of Embodiment 6 other than those described hereinafter are the same as in Embodiment 1, and will thus be given the same reference numerals, and detailed descriptions thereof will be omitted.

Figure 9:
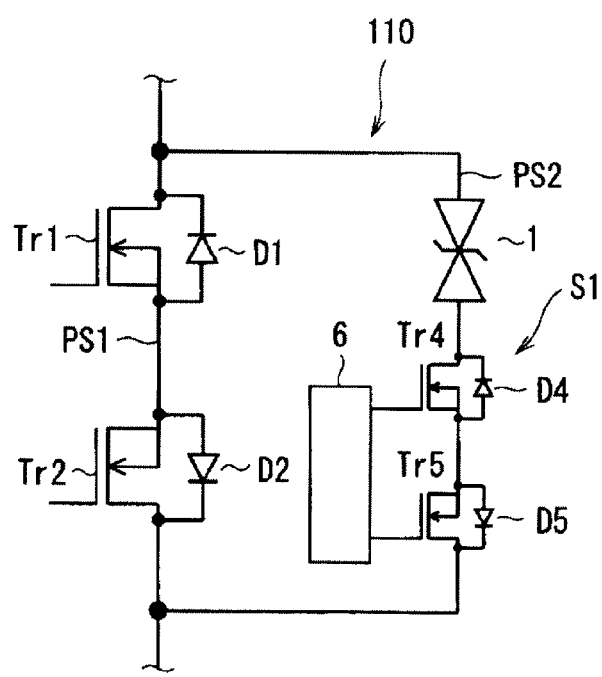
FIG. 9 is a schematic diagram illustrating part of a switch circuit according to Embodiment 6.

FIG. 9 is a schematic diagram illustrating part of a switch circuit 110 according to Embodiment 6. The switch circuit 110 with a surge protection function according to FIG. 9 is further provided with an interrupting switch S1, which is a bi-directional switch, in addition to the components of Embodiment 1. The interrupting switch S1 is connected in series to the first surge protection device 1 in the path PS2. In other words, the series circuit constituted by the first main transistor Tr1 and the second main transistor Tr2 is connected in parallel to a series circuit of the first surge protection device 1 and the interrupting switch S1. In Embodiment 6, similar to Embodiment 1, the first main transistor Tr1 and the second main transistor Tr2 function as transistor circuits.

In the example of FIG. 9, the interrupting switch S1 is provided with interrupting transistors Tr4 and Tr5. The interrupting transistors Tr4 and Tr5 are connected in series to each other, and their forward directions are opposite to each other. The interrupting transistors Tr4 and Tr5 are N-channel FETs. Furthermore, diodes D4 and D5 are respectively connected in parallel to the interrupting transistors Tr4 and Tr5. The forward directions of the interrupting transistor Tr4 and the diode D4 are opposite to each other, and the forward directions of the interrupting transistor Tr5 and the diode D5 are opposite to each other.

Accordingly, a drain electrode of the interrupting transistor Tr4 is connected to one end, on the connector 42 side, of the first surge protection device 1, and a source electrode of the interrupting transistor Tr4 is connected to the source electrode of the interrupting transistor Tr5. A drain electrode of the interrupting transistor Tr5 is connected to the drain electrode of the second main transistor Tr2. The diodes D4 and D5 are respectively parasitic diodes of the interrupting transistors Tr4 and Tr5. The cathode of the diode D4 is connected to the drain electrode of the interrupting transistor Tr4, and the anode of the diode D4 is connected to the source electrode of the interrupting transistor Tr4. The cathode of the diode D5 is connected to the drain electrode of the interrupting transistor Tr5, and the anode of the diode D5 is connected to the source electrode of the interrupting transistor Tr5.

Note that the drain electrode of the interrupting transistor Tr4 may also be connected to the drain electrode of the interrupting transistor Tr5. In this case, the source electrode of the interrupting transistor Tr4 is connected to one end, on the connector 42 side, of the first surge protection device 1, and the source electrode of the interrupting transistor Tr5 is connected to the drain electrode of the second main transistor Tr2. Furthermore, it is sufficient that the interrupting switch S1 is connected in series to the first surge protection device 1. Accordingly, the interrupting switch S1 may also be connected to one end, on the connector 41 side, of the first surge protection device 1.

Similar to the first main transistor Tr1 and the second main transistor Tr2, the interrupting transistors Tr4 and Tr5 are ON when the voltages at their gate electrodes that take the potential at their source electrodes as a reference are equal to or greater than a predetermined positive voltage. Furthermore, similar to the first main transistor Tr1 and the second main transistor Tr2, the interrupting transistors Tr4 and Tr5 are OFF when the voltages at their gate electrodes that take the potential at their source electrodes as a reference are lower than the predetermined positive voltage. The predetermined voltage of the interrupting transistor Tr4 is substantially equal to the predetermined voltage of the interrupting transistor Tr5.

The switch circuit 110 of Embodiment 6 further includes a switch control unit 6, which is connected to the gate electrodes of the interrupting transistors Tr4 and Tr5. The switch control unit 6 adjusts the voltages at the gate electrodes of the interrupting transistors Tr4 and Tr5 that take the potentials at their source electrode as a reference. Accordingly, the switch control unit 6 turns the interrupting transistors Tr4 and Tr5 on and off.

The switch control unit 6 turns on the interrupting switch S1 by turning the interrupting transistors Tr4 and Tr5 on at the same time, and turns off the interrupting switch S1 by turning the interrupting transistors Tr4 and Tr5 off at the same time.

Here, "at the same time" means not only a situation in which the timings at which turning on or off is performed completely match each other, but also a situation in which the timings at which turning on or off is performed substantially match each other.

Even when the power supply system 100 is in the inverted connection state, no large current will flow through the first surge protection device 1 if the first main transistor Tr1, the second main transistor Tr2, and the interrupting switch S1 are OFF. Accordingly, it is possible to use a first surge protection device 1 that has a lower breakdown voltage. For example, the breakdown voltage of the first surge protection device 1 may be the same breakdown voltage as in Embodiment 1. The breakdown voltages of the first surge protection device 1 and a second surge protection device 11 are higher than a difference value between the first electric storage unit 31 and the second electric storage unit 32.

Furthermore, when the power supply system 100 is in the inverted connection state, and the interrupting switch S1 is OFF, then the voltage that is applied to the series circuit of the first main transistor Tr1 and the second main transistor Tr2 is also applied to the series circuit of the interrupting switch S1 and the first surge protection device 1. At this time, the voltage that is applied to the series circuit of the first main transistor Tr1 and the second main transistor Tr2 is divided into voltages that are applied to the interrupting switch S1 and the first surge protection device 1. Thus, since the voltage that is applied to the first surge protection device 1 is low, the first surge protection device 1 or the interrupting switch S1 will not burn out.

The switch control unit 6 turns on the interrupting switch S1 prior to turning off the first main transistor Tr1 and the second main transistor Tr2. In other words, the switch control unit 6 turns off the first main transistor Tr1 and the second main transistor Tr2 in the state in which the interrupting switch S1 is in the ON state. Accordingly, when the first main transistor Tr1 and the second main transistor Tr2 are turned off, the first surge protection device 1 functions appropriately.

Figure 10:
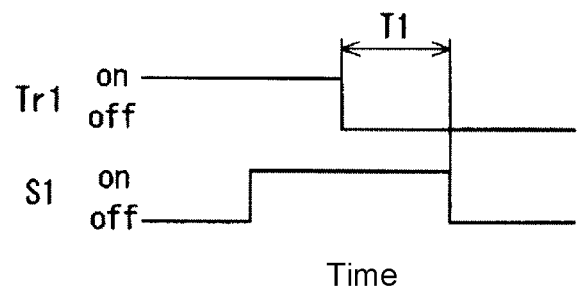
FIG. 10 is a schematic diagram illustrating an example of a timing chart of the switch circuit.

Thereafter, the interrupting switch S1 may remain ON, or may be turned off in response to ignition off of the vehicle. However, the switch control unit 6 needs to output a control voltage to keep the interrupting switch S1 ON. Here, the interrupting switch S1 is a normally-off switch. Outputting such a control voltage may consume electric power. Accordingly, the interrupting switch S1 may also be turned off when the first main transistor Tr1 and the second main transistor Tr2 are in the OFF state. In other words, the switch control unit 6 may also turn the interrupting switch S1 off when a predetermined period T1 has elapsed since the first main transistor Tr1 and the second main transistor Tr2 were turned off. FIG. 10 shows an example of a timing chart of the first main transistor Tr1 and the interrupting switch S1.

The predetermined period T1 may be set as follows. That is, a period sufficient for the value of the electric current flowing through the first surge protection device 1 to reach zero may be set as the predetermined period T1. In other words, the switch control unit 6 may turn the interrupting switch S1 off after an electric current flowing through the first surge protection device 1 has reached zero. The period can be calculated in advance by, for example, experiments or simulations. By turning off the interrupting switch S1 in the state in which the value of the electric current is zero in this way, it is possible to avoid a switching loss of the interrupting switch S1.

The switch circuit 110 of Embodiment 6 that has the above-described configuration has the same effects as the switch circuit 110 of Embodiment 1.

Note that the interrupting transistors Tr4 and Tr5 are not limited to N-channel FETs, and may be P-channel FETs. In this case, the interrupting transistors Tr4 and Tr5 are ON when the voltages at their gate electrodes that take the potentials at their source electrodes as a reference are lower than a negative predetermined voltage. Furthermore, the interrupting transistors Tr4 and Tr5 are OFF when the voltages at their gate electrodes that take the potentials at their source electrodes as a reference are equal to or greater than the negative predetermined voltage.

Alternatively, a configuration is also possible in which the interrupting switch S1 uses bipolar transistors, relay contacts or the like instead of the interrupting transistors Tr4 and Tr5.

Embodiment 7

Figure 11:
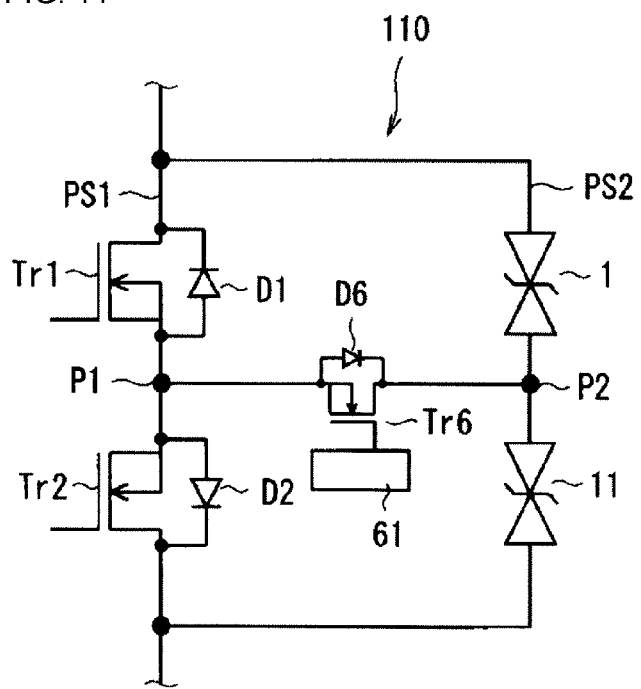
FIG. 11 is a schematic diagram illustrating part of a switch circuit according to Embodiment 7.

FIG. 11 is a schematic diagram illustrating part of a switch circuit 110 according to Embodiment 7.

The following will describe differences of Embodiment 7 from Embodiment 1. Configurations of Embodiment 7 other than those described hereinafter are the same as in Embodiment 1, and will thus be given the same reference numerals, and detailed descriptions thereof will be omitted.

The switch circuit 110 with a surge protection function according to FIG. 11 is further provided with a second surge protection device 11, in addition to the components of Embodiment 1. The second surge protection device 11 is connected in series to the first surge protection device 1 in the path PS2. In other words, the series circuit of the first surge protection device 1 and the second surge protection device 11 is connected in parallel to the series circuit of the first main transistor Tr1 and the second main transistor Tr2. In Embodiment 7, similar to Embodiment 1, the first main transistor Tr1 and the second main transistor Tr2 function as transistor circuits.

The switch circuit 110 with a surge protection function according to FIG. 11 is further provided with a protection transistor Tr6 and a diode D6, in addition to the components of Embodiment 1. The protection transistor Tr6 is connected to a connection node P1 between the first main transistor Tr1 and the second main transistor Tr2, and to a connection node P2 between the first surge protection device 1 and the second surge protection device 11. The diode D6 is connected in parallel to the protection transistor Tr6. The forward direction of the diode D6 is opposite to the forward direction of the protection transistor Tr6. In the example of FIG. 11, the forward direction of the protection transistor Tr6 is a direction from the connection point P2 toward the connection point P1. The protection transistor Tr6 is an N-channel FET.

According to such a configuration, the first main transistor Tr1, the protection transistor Tr6, and the diodes D1 and D6 constitute a bi-directional switch, and the second main transistor Tr2, the protection transistor Tr6, and the diodes D2 and D6 constitute a bi-directional switch. The diode D6 is a parasitic diode of the protection transistor Tr6.

Accordingly, a source electrode of the protection transistor Tr6 is connected to the source electrodes of the first main transistor Tr1 and the second main transistor Tr2, and a drain electrode of the protection transistor Tr6 is connected to one end, on the connector 42 side, of the first surge protection device 1, and one end of the second surge protection device 11. The other end of the second surge protection device 11 is connected to the drain electrode of the second main transistor Tr2. The cathode of the diode D6 is connected to the drain of the protection transistor Tr6, and the anode of the diode D6 is connected to the source of the protection transistor Tr6. The second surge protection device 11 has the same configuration as that of the first surge protection device 1.

Similar to the first main transistor Tr1 and the second main transistor Tr2, the protection transistor Tr6 is ON when the voltage at its gate electrode that takes the potential at its source electrode as a reference is equal to or greater than a predetermined positive voltage. Furthermore, similar to the first main transistor Tr1 and the second main transistor Tr2, the protection transistor Tr6 is OFF when the voltage at its gate electrode that takes the potential at its source electrode as a reference is lower than the predetermined positive voltage.

The switch circuit 110 of Embodiment 7 is further provided with a switch control unit 61, which is connected to a gate electrode of the protection transistor Tr6. The switch control unit 61 adjusts the voltage at the gate electrode of the protection transistor Tr6 that takes the potential at its source electrode as a reference. Accordingly, the switch control unit 61 turns on and off the protection transistor Tr6.

The first electric storage unit 31 or the second electric storage unit 32 are connected to each other in a state in which the first main transistor Tr1, the second main transistor Tr2, and the protection transistor Tr6 are OFF. At this time, no electric current will flow through the first surge protection device 1 and the second surge protection device 11 unless a voltage that is applied to the series circuit of the first main transistor Tr1 and the second main transistor Tr2 is the sum of the breakdown voltages of the first surge protection device 1 and the second surge protection device 11. Accordingly, no large current will flow through the first surge protection device 1 and the second surge protection device 11 as long as the first main transistor Tr1, the second main transistor Tr2, and the protection transistor Tr6 are OFF, even if the power supply system 100 is in the inverted connection state. Furthermore, the voltage that is applied to the series circuit of the first main transistor Tr1 and the second main transistor Tr2 is divided into voltages that are applied to the first surge protection device 1 and the second surge protection device 11. Accordingly, since the voltages that are applied to the first surge protection device 1 and the second surge protection device 11 are low, the first surge protection device 1 or the second surge protection device 11 will not burn out.

In a case where the protection transistor Tr6 is ON, an electric current will flow through the first surge protection device 1, the protection transistor Tr6, and the diode D2 in this order when the voltage at the drain electrode of the first main transistor Tr1 that takes the potential at the drain electrode of the second main transistor Tr2 as a reference becomes the breakdown voltage of the first surge protection device 1. In the same case, an electric current will flow through the second surge protection device 11, the protection transistor Tr6, and the diode D1, in this order when the voltage at the drain electrode of the second main transistor Tr2 that takes the potential at the drain electrode of the first main transistor Tr1 as a reference becomes the breakdown voltage of the second surge protection device 11.

Accordingly, for example, surge protection devices that have the same breakdown voltage as that of Embodiment 1 can be used as the first surge protection device 1 and the second surge protection device 11.

The switch control unit 61 turns on the protection transistor Tr6 prior to turning off the first main transistor Tr1 and the second main transistor Tr2. In other words, the switch control unit 6 can turn off the first main transistor Tr1 and the second main transistor Tr2 in the state in which the protection transistor Tr6 is ON. Accordingly, when the first main transistor Tr1 and the second main transistor Tr2 are turned off, the first surge protection device 1 and the second surge protection device 11 functions appropriately.

When the first main transistor Tr1 and the second main transistor Tr2 are turned off in the state in which an electric current is flowing from the connector 41 to the connector 42 via the first main transistor Tr1 and the second main transistor Tr2, as described above, the voltage of the connector 41 that takes the potential of the connector 42 as a reference increases. When the voltage becomes the breakdown voltage of the first surge protection device 1, an electric current flows from the connector 41 to the first surge protection device1, the protection transistor Tr6, and the diode D2, in this order.

Similarly, when the first main transistor Tr1 and the second main transistor Tr2 are turned off in the state in which an electric current is flowing from the connector 42 to the connector 41 via the second main transistor Tr2 and the first main transistor Tr1, as described above, the voltage of the connector 42 that takes the potential of the connector 41 as a reference increases. When the voltage becomes the breakdown voltage of the second surge protection device 11, an electric current flows from the connector 42 to the second surge protection device 11, the protection transistor Tr6, and the diode D1 in this order.

Therefore, the switch circuit 110 of Embodiment 7 has the same effects as the switch circuit 110 of Embodiment 1.

After having been turned on, the protection transistor Tr6 may remain ON, or may be turned off in response to ignition off of the vehicle. However, the switch control unit 61 needs to output a control voltage to keep the protection transistor Tr6 ON. Here, the protection transistor Tr6 is a normally-off switch. Outputting such a control voltage may consume electric power. Accordingly, similar to the interrupting switch S1, the protection transistor Tr6 may also be turned off when a predetermined period has elapsed since the first main transistor Tr1 and the second main transistor Tr2 were turned off.

Furthermore, the switch control unit 61 may also turn off the protection transistor Tr6 when the electric current flowing through the first surge protection device 1 and the second surge protection device 11 becomes zero. Accordingly, it is possible to reduce a switching loss of the protection transistor Tr6.

Note that in Embodiment 7, it is sufficient that the protection transistor Tr6 functions as a switch, and thus a bipolar transistor, an IGBT, or the like may be used as the protection transistor Tr6.

Embodiment 8

In Embodiment 1, the drain electrode of the first main transistor Tr1 is connected to the drain electrode of the second main transistor Tr2. However, the connection between the first main transistor Tr1 and the second main transistor Tr2 is not limited to such connection.

The following will describe differences of Embodiment 8 from Embodiment 1. Configurations of Embodiment 8 other than those described hereinafter are the same as in Embodiment 1, and will thus be given the same reference numerals, and detailed descriptions thereof will be omitted.

Figure 12:
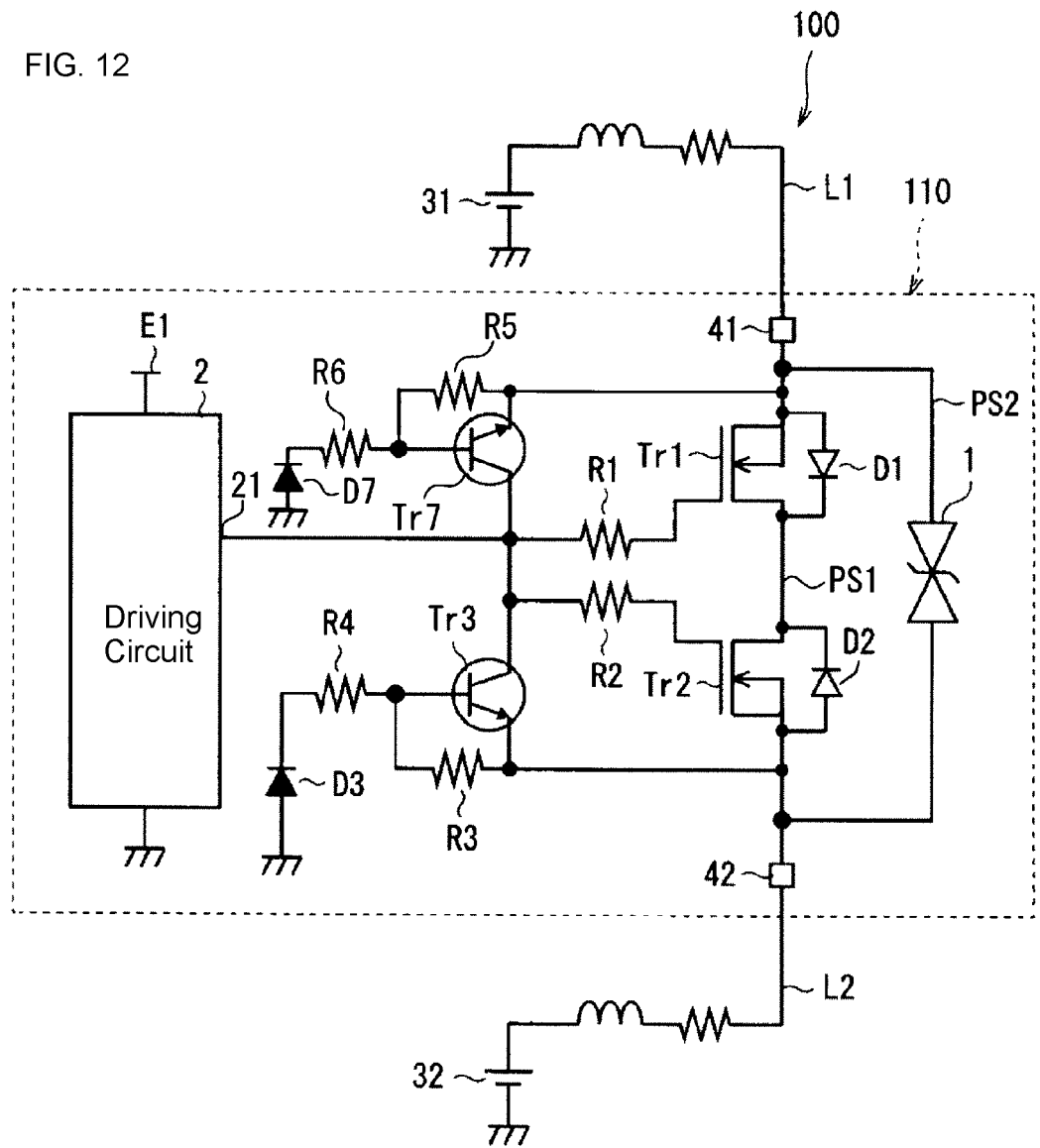
FIG. 12 is a schematic diagram illustrating a power supply system according to Embodiment 8.

FIG. 12 is a schematic diagram illustrating a power supply system 100 according to Embodiment 8. In the switch circuit 110 of Embodiment 8, a drain electrode of a first main transistor Tr1 is connected to a drain electrode of a second main transistor Tr2. Source electrodes of the first main transistor Tr1 and the second main transistor Tr2 are respectively connected to connectors 41 and 42. The cathode of a diode D1 is connected to the cathode of a diode D2, and the anodes of the diodes D1 and D2 are respectively connected to the connectors 41 and 42. A first surge protection device 1 is connected between the connectors 41 and 42. An emitter electrode of a sub transistor Tr3 is connected to the source electrode of the second main transistor Tr2. Since the cathodes of the diodes D1 and D2 are connected to each other, no electric current will flow through the diodes D1 and D2 when the first main transistor Tr1 and the second main transistor Tr2 are OFF. In Embodiment 8, similar to Embodiment 1, the first main transistor Tr1 and the second main transistor Tr2 function as transistor circuits.

The switch circuit 110 is further provided with a sub transistor Tr7, a diode D7, and resistors R5 and R6. The sub transistor Tr7 is an NPN bipolar transistor. An emitter electrode of the sub transistor Tr7 is connected to the source electrode of the first main transistor Tr1, and a collector electrode of the sub transistor Tr7 is connected to a gate electrode of the first main transistor Tr1 via a resistor R1, and to a gate electrode of the second main transistor Tr2 via a resistor R2. The resistor R5 is connected between the emitter electrode and a base electrode of the sub transistor Tr3. One end of the resistor R6 is connected to the base electrode of the sub transistor Tr3, and the other end of the resistor R6 is connected to the cathode of the diode D7. The anode of the diode D7 is grounded.

Similar to the sub transistor Tr3, the sub transistor Tr7 is ON when the voltage at its base electrode that takes the potential at its emitter electrode as a reference is equal to or greater than a predetermined positive voltage. Furthermore, similar to the sub transistor Tr3, the sub transistor Tr7 is OFF when the voltage at its base electrode that takes the potential at its emitter electrode as a reference is lower than the predetermined positive voltage. The sub transistor Tr7 is turned on or off depending on the voltage at its base electrode that takes the potential at its emitter electrode as a reference.

The predetermined voltage at which the sub transistor Tr7 is turned on and off is also sufficiently lower than the predetermined voltage at which the first main transistor Tr1 is turned on and off, and is also sufficiently lower than the predetermined voltage at which the second main transistor Tr2 is turned on and off.

When the first main transistor Tr1 and the second main transistor Tr2 are turned off in a state in which an electric current is flowing from the connector 41 to the connector 42, then the sub transistor Tr3 functions as in Embodiment 1, and the gate-source voltage of the second main transistor Tr2 graphs in the same manner as the gate-source voltage shown in FIG. 1. Accordingly, the second main transistor Tr2 remains OFF after the first main transistor Tr1 and the second main transistor Tr2 were turned off.

Figure 13:
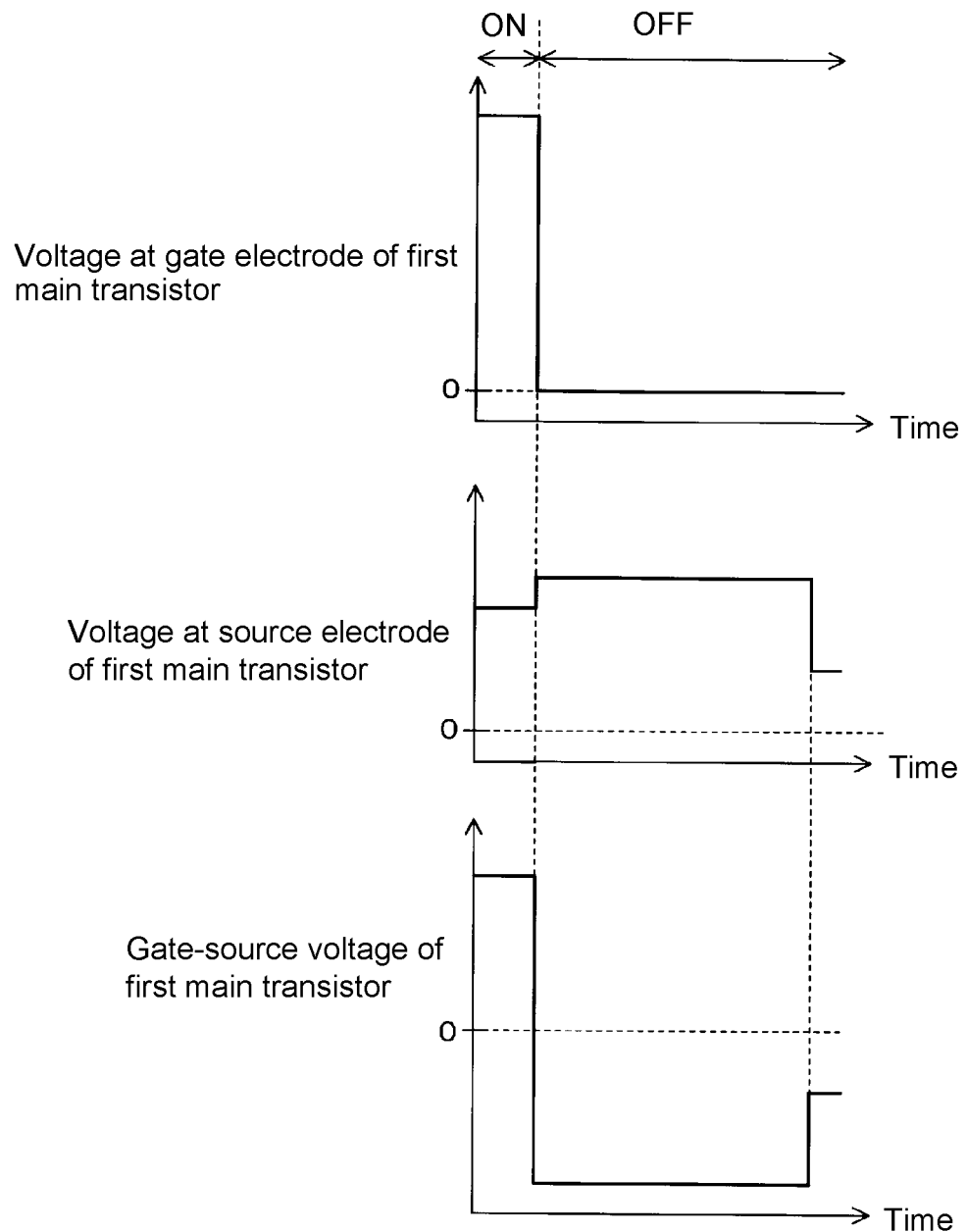
FIG. 13 is a diagram illustrating an operation of the switch circuit.

FIG. 13 illustrates an operation of the switch circuit 110. FIG. 13 shows graphs of voltages at the gate electrode and the source electrode of the first main transistor Tr1, and a graph of the gate-source voltage of the first main transistor Tr1. In these graphs, the horizontal axes denote time. The voltages at the gate electrode and the source electrode shown in FIG. 13 are voltages that take the ground potential as a reference. The gate-source voltage is a voltage at the gate that takes the potential at the source electrode as a reference.

Similar to Embodiment 1, when the driving circuit 2 has turned on the first main transistor Tr1 and the second main transistor Tr2, the voltage of the connector 41 that takes the ground potential as a reference is substantially equal to the terminal voltage of the first electric storage unit 31, and is a positive voltage. Accordingly, due to the behavior of diode D7, no electric current will flow through the resistor R5. As a result, the voltage at the base electrode of the sub transistor Tr7 that takes the potential at its emitter electrode as a reference is zero [V], and thus is lower than the predetermined positive voltage. Accordingly, the sub transistor Tr7 is OFF when the first main transistor Tr1 and the second main transistor Tr2 are ON.

Similar to Embodiment 1, the driving circuit 2 adjusts the voltages at the gate electrodes of the first main transistor Tr1 and the second main transistor Tr2 from a set voltage to, for example, zero [V] to turn off the first main transistor Tr1 and the second main transistor Tr2. The wire inductance of the wire L1 raises the voltage of the connector 41 that takes the ground potential as a reference until the voltage between the connectors 41 and 42 is a breakdown voltage of the first surge protection device 1. At this time, the voltage at the emitter electrode of the sub transistor Tr7 that takes the ground potential as a reference is still a positive voltage, and thus the sub transistor Tr7 remains OFF.

If the voltages at the gate electrodes of the first main transistor Tr1 and the second main transistor Tr2 are adjusted from the set voltage to zero [V], then the voltage at the source electrode of the first main transistor Tr1 increases, and thus the gate-source voltage of the first main transistor Tr1 is a negative voltage. Therefore, the gate-source voltage of the first main transistor Tr1 does not become equal to or greater than the predetermined positive voltage, and thus the first main transistor Tr1 remains OFF.

The first surge protection device 1 functions as in Embodiment 1. Accordingly, when the first main transistor Tr1 and the second main transistor Tr2 are turned off, then an electric current flows through the first surge protection device 1 until energy accumulated in the wires L1 and L2 becomes zero. The electric current decreases at a constant slope. When the energy accumulated in the wires L1 and L2 have become zero, the voltage at the source electrode of the first main transistor Tr1 decreases to the terminal voltage of the first electric storage unit 31 that takes the ground potential as a reference, and the gate-source voltage of the first main transistor Tr1 increases. At this time, the gate-source voltage is still a negative voltage, and the absolute value of the voltage is substantially equal to the terminal voltage of the first electric storage unit 31 that takes the ground potential as a reference.

The operation of the switch circuit 110 in which an electric current flows from the connector 42 to the connector 41 is the same as the operation of the switch circuit 110 in which an electric current flows from the connector 41 to the connector 42. When an electric current flows from the connector 42 to the connector 41, and the first main transistor Tr1 and the second main transistor Tr2 are turned off, then the sub transistor Tr7 operates in the same manner as the sub transistor Tr3 when an electric current flows from the connector 41 to the connector 42. Accordingly, the first main transistor Tr1 remains OFF after the first main transistor Tr1 and the second main transistor Tr2 were turned off. Here, the diode D7, and the resistors R5 and R6 respectively correspond to the diode D3, and the resistors R3 and R4.

When the driving circuit 2 has turned on the first main transistor Tr1 and the second main transistor Tr2, the voltage of the connector 42 that takes the ground potential as a reference is substantially equal to the terminal voltage of the second electric storage unit 32, and thus is a positive voltage. Accordingly, due to the behavior of the diode D3, no electric current will flow through the resistor R3. As a result, the voltage at the base electrode of the sub transistor Tr3 that takes the potential at its emitter electrode as a reference is zero [V], and thus is lower than the predetermined positive voltage. Accordingly, the sub transistor Tr7 is OFF when the first main transistor Tr1 and the second main transistor Tr2 are ON.

The driving circuit 2 adjusts the voltages at the gate electrodes of the first main transistor Tr1 and the second main transistor Tr2 from the set voltage to, for example, zero [V] to turn off the first main transistor Tr1 and the second main transistor Tr2. The wire inductance of the wire L2 raises the voltage of the connector 42 that takes the ground potential as a reference, until the absolute value of the voltage between the connectors 41 and 42 becomes the breakdown voltage of the first surge protection device 1. At this time, the voltage at the emitter electrode of the sub transistor Tr3 that takes the ground potential as a reference is still a positive voltage, and the sub transistor Tr3 remains OFF.

If the voltages at the gate electrodes of the first main transistor Tr1 and the second main transistor Tr2 are adjusted from the set voltage to zero [V], then the voltage at the source electrode of the second main transistor Tr2 increases, and thus the gate-source voltage of the second main transistor Tr2 is a negative voltage. Therefore, the gate-source voltage of the second main transistor Tr2 does not become equal to or greater than the predetermined positive voltage, and thus the first main transistor Tr1 remains OFF. Here, the gate-source voltage of the second main transistor Tr2 is a voltage at the gate that takes the potential at the source electrode as a reference.

The first surge protection device 1 functions as in Embodiment 1. Accordingly, when the first main transistor Tr1 and the second main transistor Tr2 are turned off, then an electric current flows through the first surge protection device 1 until energy accumulated in the wires L1 and L2 becomes zero. The electric current decreases at a constant slope. When the energy accumulated in the wires L1 and L2 becomes zero, the voltage at the source electrode of the first main transistor Tr1 decreases to the terminal voltage of the second electric storage unit 32 that takes the ground potential as a reference, and the gate-source voltage of the second main transistor Tr2 increases. At this time, the gate-source voltage is still a negative voltage, and the absolute value of the voltage is substantially equal to the terminal voltage of the second electric storage unit 32 that takes the ground potential as a reference.

The switch circuit 110 of Embodiment 8 that has the above-described configuration has the same effects as the switch circuit 110 of Embodiment 1.

Note that in Embodiment 8, a plurality of series circuits constituted by a first main transistor Tr1 and a second main transistor Tr2 may be connected in parallel to each other as with in Embodiment 4. In this case, the drain electrode of a first main transistor Tr1 is connected to the drain electrode of a second main transistor Tr2. The source electrodes of the first main transistors Tr1 are connected to the emitter electrode of the sub transistor Tr7, and the source electrodes of the second main transistors Tr2 are connected to the emitter electrode of the sub transistor Tr3.

Moreover, in Embodiment 8, a plurality of first main transistors Tr1 may be connected in parallel to each other, or a plurality of second main transistors Tr2 may be connected in parallel to each other, as with in Embodiment 5. Furthermore, in Embodiment 8, an interrupting switch S1 may be connected in series to the first surge protection device 1 as with in Embodiment 6. Furthermore, in Embodiment 8, a second surge protection device 11 may also be connected between one end, on the connector 42 side, of the first surge protection device 1, and the source electrode of the second main transistor Tr2, and a protection transistor Tr6 may also be connected between the drain electrodes of the first main transistor Tr1 and the second main transistor Tr2, and one end, on the connector 42 side, of the first surge protection device 1, as with in Embodiment 7. In this case, if the protection transistor Tr6 is an N-channel FET, then the drain electrode of the protection transistor Tr6 is connected to the drain electrodes of the first main transistor Tr1 and the second main transistor Tr2, and the source electrode of the protection transistor Tr6 is connected to one end, on the connector 42 side, of the first surge protection device 1. Furthermore, in Embodiment 8, the sub transistor Tr7 is not limited to an NPN bipolar transistor, and may be an N-channel FET.

Furthermore, in Embodiments 1 to 8, the sub transistor Tr3 is not limited to an NPN bipolar transistor, and may be an N-channel FET.

The configurations described in the foregoing embodiments and modifications may suitably be combined with each other as long as they are consistent to each other.

The present invention has been described in detail, but the descriptions above are examples in all respects without the present invention being not limited to them. It is construed that numerous modifications that are not shown as examples are conceivable without departing from the scope of the present invention.

The invention claimed is:

1. A switch circuit for use in a vehicle comprising:
   a transistor circuit including a first main transistor and a second main transistor, the first main transistor includes a first electrode, a second electrode, and a control electrode, and in which conduction between the first electrode and the second electrode is switched on or off depending on a voltage between the control electrode and the second electrode, the second main transistor is connected to the first electrode or the second electrode of the first main transistor, and the first main transistor and the second main transistor are turned on or off at the same time;
   a first surge protection device that is connected between ends of the transistor circuit, and is configured to keep a voltage that is applied to the first surge protection device at a first predetermined voltage or lower; and
   a sub transistor that is provided between the control electrode and the second electrode of the first main transistor, and is turned on when the first main transistor is turned off,
   a first wire is connected to one end of the transistor circuit,
   a second wire is connected to another end of the transistor circuit,
   an electric current flows through the first wire, the transistor circuit, and the second wire while the first main transistor is ON, and
   an electric current flows through the first wire, the first surge protection device, and the second wire when the first main transistor is turned off; and
   a second surge protection device that is connected between the transistor circuit and the first surge protection device, and is configured to keep a voltage that is applied to the second surge protection device at a second predetermined voltage or lower; and
   a protection transistor that is connected between a connection node located between the first main transistor and the second main transistor, and a connection node located between the first surge protection device and the second surge protection device.

2. The switch circuit according to claim 1, further comprising:
an interrupting switch that is connected between the transistor circuit and the first surge protection device.

3. The switch circuit according to claim 2, further comprising:
a switch control unit that is configured to turn on the interrupting switch prior to turning on the first main transistor, and turn off the interrupting switch when a predetermined period has elapsed since the first main transistor was turned off.

4. The switch circuit according to claim 1, further comprising:
a switch control unit that is configured to turn on the protection transistor prior to turning on the first main transistor and the second main transistor, and turn off the protection transistor when a predetermined period has elapsed since the first main transistor and the second main transistor were turned off.

5. The switch circuit according to claim 1, wherein an energy is accumulated in the first wire and the second wire, due to an electric current flowing through the first wire, the transistor circuit, and the second wire while the first main transistor is ON, and the energy accumulated in the first wire and the second wire is consumed, due to an electric current flowing through the first wire, the first surge protection device, and the second wire when the first main transistor is turned off.

6. The switch circuit according to claim 1, further including a first electric storage unit having a positive electrode, the positive electrode of the first electric storage unit is connected to the one end of the transistor circuit via the first wire, and a positive electrode of a second electric storage unit is connected to the other end of the transistor circuit via the second wire.

7. The switch circuit according to 1, wherein the sub transistor includes:
a third electrode that is connected to the second electrode of the first main transistor; a fourth electrode that is connected to the control electrode of the first main transistor; and a second control electrode,
the sub transistor is turned on if a voltage at the second control electrode that takes a potential at the third electrode as a reference is equal to or greater than a predetermined voltage, and
the switch circuit further includes:
a resistor that is connected between the third electrode and the second control electrode of the sub transistor; and
a diode whose cathode is connected to the second control electrode of the sub transistor, and whose anode is grounded.

8. A power supply system comprising:
the switch circuit according to claim 1; and
a first electric storage unit whose positive electrode is connected to the one end of the transistor circuit via the first wire; and
a second electric storage unit whose positive electrode is connected to the other end of the transistor circuit via the second wire.

* * * * *